(12) United States Patent
Ishigaki et al.

(10) Patent No.: US 6,191,933 B1
(45) Date of Patent: Feb. 20, 2001

(54) CERAMIC CAPACITOR

(75) Inventors: Takaya Ishigaki, Honjo; Masatoshi Ishikawa, Akita; Takashi Kamiya, Akita; Shunji Itakura, Yotsukaido; Yuji Aiba, Akita; Masanori Yamamoto, Akita, all of (JP)

(73) Assignee: TDK Corporation, Tokyo (JP)

( * ) Notice: Under 35 U.S.C. 154(b), the term of this patent shall be extended for 0 days.

(21) Appl. No.: 09/226,918

(22) Filed: Jan. 5, 1999

(30) Foreign Application Priority Data

| Jan. 7, 1998 | (JP) | 10-001884 |
| Jan. 29, 1998 | (JP) | 10-017565 |
| Feb. 9, 1998 | (JP) | 10-027629 |
| May 8, 1998 | (JP) | 10-142226 |

(51) Int. Cl.$^7$ .................................................. H01G 4/228
(52) U.S. Cl. ........................ 361/309; 361/321.2; 361/328
(58) Field of Search .................................. 361/303, 306.1, 361/306.3, 308.1, 309–310, 313, 328, 321.2–321.5

(56) References Cited

U.S. PATENT DOCUMENTS

| 5,716,481 | 2/1998 | Kobayashi et al. ............... 156/249 |
| 5,805,409 | 9/1998 | Takahara et al. ................. 361/303 |
| 5,935,365 | * 8/1999 | Kobayashi et al. ............... 156/249 |
| 6,046,902 | * 4/2000 | Nakagawa et al. .............. 361/306.1 |

FOREIGN PATENT DOCUMENTS

| 4-171911 | 6/1992 | (JP) . |
| 4-188810 | 7/1992 | (JP) . |
| 4-188813 | 7/1992 | (JP) . |
| 4-259205 | 9/1992 | (JP) . |
| 5-46258 | 12/1993 | (JP) . |
| 8-17679 | 1/1996 | (JP) . |

* cited by examiner

Primary Examiner—Anthony Dinkins
(74) Attorney, Agent, or Firm—Oblon, Spivak, McClelland, Maier & Neustadt, P.C.

(57) ABSTRACT

The present invention relates to a ceramic capacitor having metal plate terminals that absorb thermal stress and mechanical stress caused by flexure of the substrate. A ceramic capacitor element is provided with terminal electrodes at the two side end surfaces facing opposite each other. The metal plate terminals are each connected to one of the terminal electrodes at one end thereof, are each provided with a folded portion in a middle area and a terminal portion to be connected to the outside toward the other end from the folded portion.

26 Claims, 14 Drawing Sheets

Prior Art

CERAMIC CAPACITOR

BACKGROUND OF THE INVENTION

1. Field of the Invention

The present invention relates to a ceramic capacitor, and more specifically it relates to a ceramic capacitor employed as a smoothing capacitor for a switching source.

2. Discussion of Background

Up to the present time, most smoothing capacitors for switching sources have been constituted of aluminum electrolytic capacitors. However, as the demand for both miniaturization and improved reliability have increased in the market, the need for a compact ceramic capacitor assuring a high degree of reliability has also increased.

Generally speaking, since a great deal of heat is generated in the vicinity of a source, substrates are normally constituted of an aluminum having a high heat discharge capacity. However, since the temperature in the vicinity of the source changes greatly when the source is turned on and off, a great deal of thermal stress occurs at a ceramic capacitor mounted on the aluminum substrate, which has a high coefficient of thermal expansion. This thermal stress causes cracking to occur at the ceramic capacitor, which, in turn, may induce problems such as shorting defects and arcing.

In order to prevent problems such as arcing, it is crucial that the thermal stress occurring at the ceramic capacitor be reduced. As a means for reducing the thermal stress, Japanese Examined Utility Model Publication No. 46258/1993, Japanese Unexamined Patent Publication No. 171911/1992, Japanese Unexamined Patent Publication No. 259205/1992 and the like disclose a structure achieved by soldering a metal plate onto a terminal electrode of the ceramic capacitor and mounting the metal plate onto the aluminum substrate to prevent the ceramic capacitor from being soldered directly onto the aluminum substrate.

Under normal circumstances, it is necessary to set the length of the leg portion of the metal plate extending from the terminal portion to be soldered onto the aluminum substrate to the portion where it is connected to the ceramic capacitor as large as possible in order to ensure that the thermal stress caused by the expansion and contraction of the aluminum substrate is absorbed to a sufficient degree. However, since products in the prior art adopt a structure in which the height of the ceramic capacitor is bound to increase if the legs of the metal plate are lengthened, the length of the leg of the metal plate must be restricted to ensure that it is less than the allowable height that is permitted on the substrate.

Because of this, the length of the legs of the metal plate cannot be set at a large value in the products in the prior art and, consequently, if the ceramic capacitor is continuously operated over an extended period of time in an environment where the temperature changes drastically (−55° C. to 120° C.), as in the vicinity of a source, cracks will occur near the ends of the ceramic capacitor, presenting a high risk of arcing. This gravely compromises the reliability of the ceramic capacitor and has been a obstacle to the wider use of ceramic capacitors.

In addition, the metal plate in the prior art is constituted of phosphor bronze, silver, copper, stainless steel, aluminum, nickel silver or the like. However, these metals all have a coefficient of average linear expansion that is markedly higher than the coefficient of average linear expansion of the ceramic dielectric material constituting the ceramic capacitor. Thus, if any of them is employed to constitute a component to be mounted in the vicinity of a source where the temperature changes greatly, a great deal of stress is applied to, in particular, the area where the metal plate is connected due to the difference between the coefficient of average linear expansion of the ceramic capacitor element and the coefficient of average linear expansion of the metal plate to result in cracking occurring near the ends of the ceramic capacitor, which may lead to problems such as continuity defects, arcing and the like.

Furthermore, ceramic capacitors achieving a large capacity by laminating a plurality of laminated ceramic capacitor elements, soldering metal plate terminals onto terminal electrodes of the individual laminated ceramic capacitor elements and electrically connecting in parallel the plurality of laminated ceramic capacitor elements have been proposed (e.g., Japanese Unexamined Patent Publication No. 188810/1992, Japanese Unexamined Patent Publication No. 17679/1996).

Normally, soldering paste containing solder particulates, rosin-type resin, an actuator and the like is employed to solder and secure metal plate terminals onto the terminal electrodes of laminated ceramic capacitor elements. The activator is constituted of a halogen compound containing chlorine and the like. The particle size of the solder particulate is set at approximately 1 $\mu$m to 50 $\mu$m. The rosin-type resin content is set within the range of 50 wt % to 55 wt %. The content of the activator which is constituted of a halogen compound containing chlorine and the like is set at approximately 1%. In addition, the distance formed between the individual capacitor elements when combining the laminated ceramic capacitor elements is maintained within a range of 10 $\mu$m to 20 $\mu$m.

However, when soldering the metal plate terminals onto the individual terminal electrodes of the laminated ceramic capacitor elements, the solder particles and the flux contained in the soldering paste enter the gaps between the laminated ceramic capacitor elements to result in buildup occurring due to the solder balls and the flux, presenting problems such as shorting defects between the terminals and deteriorated insulation.

SUMMARY OF THE INVENTION

It is an object of the present invention to provide a ceramic capacitor in which cracks, damage and the like can be prevented from occurring at the ceramic capacitor element with a high degree of reliability.

It is a further object of the present invention to provide a ceramic capacitor in which the thermal stress and the mechanical stress occurring at the ceramic capacitor element can be reduced.

It is a still further object of the present invention to provide a ceramic capacitor in which the length of the metal plate terminal extending from the terminal portion located toward the substrate to the ceramic capacitor element is increased without increasing its height.

It is a still further object of the present invention to provide a ceramic capacitor in which cracks, damage and the like can be prevented from occurring at the ceramic capacitor element with a high degree of reliability within a temperature range of −55° C. to 125° C.

It is a still further object of the present invention to provide a ceramic capacitor achieving an improvement in reliability by preventing solder particles and soldering flux from entering gaps between the ceramic capacitor elements.

In order to achieve the objects described above, the present invention discloses a structure of metal plate terminals, the material that should be selected to constitute the metal plate terminals, the correlation between the coefficient of linear expansion of the ceramic capacitor elements and the coefficient of linear expansion of the metal plate terminals and the soldering requirements to be fulfilled when soldering the ceramic capacitor elements and the metal plate terminals.

In regard to the structure of the metal plate terminals, the ceramic capacitor according to the present invention includes at least one ceramic capacitor element and at least a pair of metal plate terminals. Terminal electrodes are provided at the two diametrical side end surfaces of the ceramic capacitor element.

The metal plate terminals are each connected to one of the terminal electrodes at one end, and are each provided with a folded portion in the middle, with a terminal portion to be connected to an external conductor such as a substrate provided toward the other end of the folded portion.

In the metal plate terminals structured as described above, the folded portions increase the lengths which extend from the terminal portions to the ends that are connected to the terminal electrodes of the ceramic capacitor element. In addition, the folded portions achieve a spring-like effect. This ensures that the flexure and the thermal expansion of the substrate are absorbed with a high degree of reliability to reduce the mechanical stress and the thermal stress occurring at the ceramic capacitor element so that cracks can be prevented from occurring at the ceramic capacitor element. Consequently, even when the ceramic capacitor according to the present invention is employed as a smoothing capacitor for a switching source that is often mounted at an aluminum substrate, cracks can be prevented from occurring so that the risk of arcing can be eliminated.

In addition, by providing the folded portion at the metal plate terminal, the flexure and the thermal expansion of the substrate are absorbed to prevent mechanical stress and thermal stress from occurring at the ceramic capacitor element, and an increase in the height is prevented. Thus, the length of the metal plate terminal extending from the terminal portion located toward the substrate to the ceramic capacitor element mounting portions can be increased without increasing its height, to improve the absorbing effect with respect to flexure and the thermal expansion of the substrate so that the mechanical stress and the thermal stress occurring at the ceramic capacitor element can be reduced.

The metal plate terminals are each constituted of a metal material having a coefficient of average linear expansion $\alpha$ of $13 \times 10^{-6}$ or lower over the range of $-55°$ C. to $125°$ C. It has been learned that by constituting the metal plate terminals with a metal material achieving such a coefficient of average linear expansion $\alpha$, cracks do not occur and the risk of arcing is eliminated even when it is used continuously over an extended period of time in an environment where the temperature changes drastically over the range of $-55°$ C. to $125°$ C. Consequently, even when the ceramic capacitor according to the present invention is employed as a smoothing capacitor in a switching source that is turned on/off frequently and may experience a temperature fluctuation within the range of $-55°$ C. to $125°$ C., a sufficient degree of reliability is assured. The coefficient of average linear expansion $\alpha$ as referred to in the present invention refers to the average value of coefficients of linear expansion measured at a plurality of different temperatures.

In regard to the coefficients of linear expansion of the ceramic capacitor element and the metal plate terminals, $\alpha_1 < \alpha_2$ is satisfied with $\alpha_1$ representing the coefficient of average linear expansion of the ceramic capacitor element over a range of $25°$ C. to $-55°$ C. and $\alpha_2$ representing the coefficient of average linear expansion of the ceramic capacitor element over a range of $25°$ C. to $125°$ C., and the coefficient of average linear expansion $\beta$ of the metal plate terminals over the range of $-55°$ C. to $125°$ C. satisfies $\beta < 1.3 \alpha_2$ and $\beta > 0.7 \alpha_1$.

It has been confirmed that when the coefficients of average linear expansion $\alpha_1$, $\alpha_2$ and $\beta$ satisfy the requirements presented above, cracks, damage and the like are prevented from occurring at the ceramic capacitor element with a high degree of reliability over the temperature range of $-55°$ C. to $125°$ C.

When the main constituent of the dielectric is barium titanate, the coefficients of average linear expansion of the ceramic dielectric satisfies $\alpha_1 \leq 7 \times 10^{-6}$ and $\alpha_2 \geq 9 \times 10^{-6}$. When the main constituent of the ceramic dielectric is a lead type complex perovskite, $\alpha_1 \leq 2 \times 10^{-6}$ and $\alpha_2 \geq 3 \times 10^{-6}$ are satisfied.

Consequently, the coefficient of average linear expansion $\beta$ of the metal plate terminals must be set by taking into consideration the different coefficients of average linear expansion $\alpha_1$ and $\alpha_2$ manifesting when the main constituent of the dielectric is barium titanate and when it is lead-type complex perovskite so that the requirements described earlier are satisfied in both cases.

The soldering requirements for soldering the ceramic capacitor element and the metal plate terminals are adopted when producing a combined ceramic capacitor constituted by combining a plurality of ceramic capacitor elements. The plurality of ceramic capacitor elements are each laminated while maintaining a distance of 20 µm or less with their terminal electrodes soldered to the metal plate terminals. A soldering paste containing solder particles 90% or more of which achieve a particle size of 35 µm to 55 µm is used in the soldering process. In the combined ceramic capacitor achieved in this manner, the solder particles and the soldering flux do not enter the gaps between the ceramic capacitor elements. This contributes to an improvement in the reliability.

BRIEF DESCRIPTION OF THE DRAWINGS

Other objects, structural features and advantages of the present invention are explained in further detail by referring to the attached drawings, provided simply to illustrate examples, wherein.

DETAILED DESCRIPTION OF THE PREFERRED EMBODIMENTS

I. Metal Plate Terminal Structure

Figure 1:
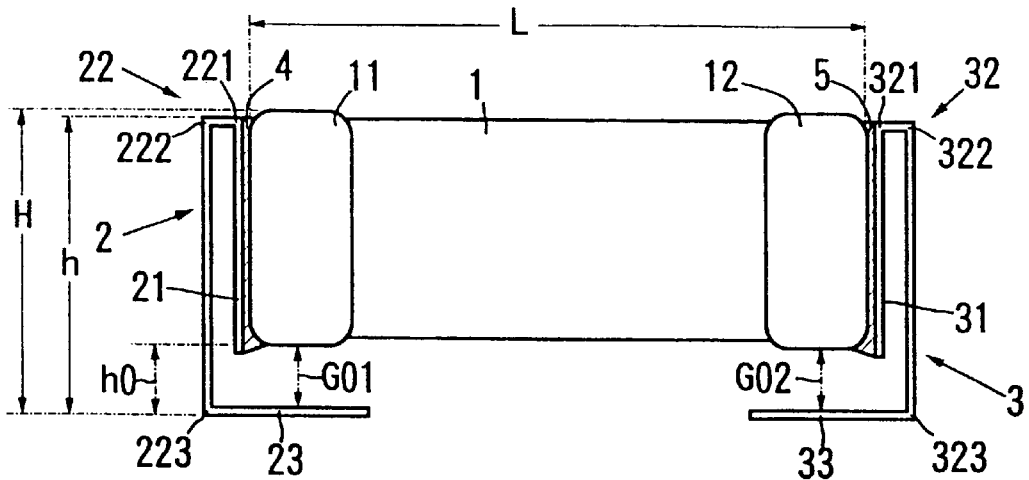
FIG. 1 is a frontal view of the ceramic capacitor according to the present invention.
Figure 2:
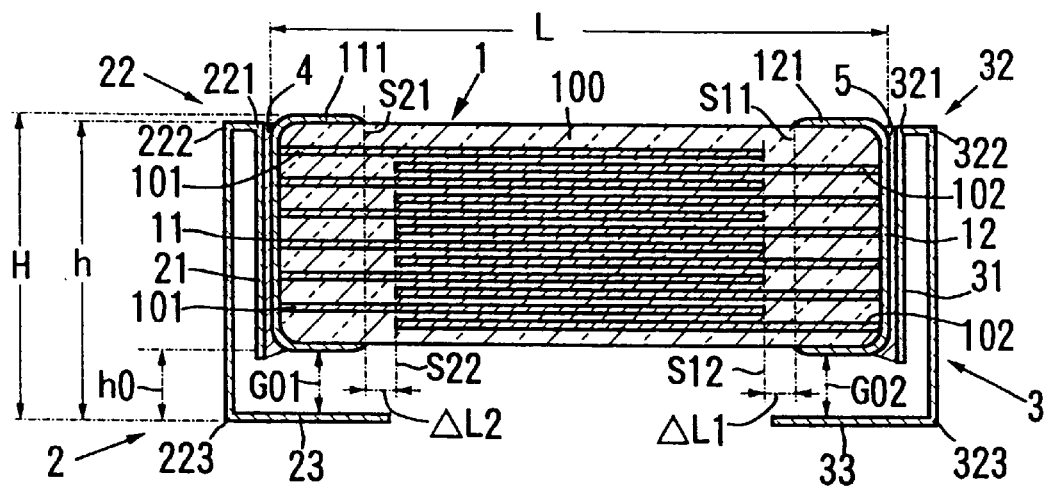
FIG. 2 is a frontal sectional view of the ceramic capacitor in FIG. 1.

In reference to FIGS. 1 and 2, the ceramic capacitor according to the present invention includes one ceramic capacitor element 1 and a pair of metal plate terminals 2 and 3. The ceramic capacitor element 1 is provided with terminal electrodes 11 and 12 at the two side end surfaces facing opposite each other in the direction of the length L.

The ceramic capacitor element 1 is provided with a number of (e.g., 100 layers) internal electrodes 101 and 102 inside a ceramic dielectric base body 100. The internal electrodes 101 are each connected to the terminal electrode 11 at one end, with the other ends constituting free ends, and the internal electrodes 102 are each connected to the terminal electrode 12 at one end with the other ends constituting free ends. The materials to constitute the terminal electrodes 11 and 12, the internal electrodes 101 and 102 and the ceramic dielectric base body 100, the methods for manufacturing them and the like are of the known art.

It is desirable that each internal electrode 101 be formed to create a distance $\Delta L1$ between its free end and the terminal electrode 12. Each internal electrode 102 should be formed to create a distance $\Delta L2$ between its free end and the terminal electrode 11. The distances $\Delta L1$ and $\Delta L2$ are minimum distances between the free end and terminal electrode 11 and the free end and the terminal electrode 12. In more specific terms, the distance $\Delta L1$ is given as the distance between the line S11 drawn in the direction of the thickness of the ceramic dielectric base body 100 from the front end of a hanging portion 121 of the terminal electrode 12 deposited onto the front surface and the rear surface of the ceramic dielectric base body 100 and the line S12 drawn in the direction of the thickness of the ceramic dielectric base body 100 from the front end of the free ends. The distance $\Delta L2$ is given as the distance between the line S21 drawn in the direction of the thickness of the ceramic dielectric base body 100 from the front end of a hanging portion 111 of the terminal electrode 11 deposited onto the front surface and the rear surface of the ceramic dielectric base body 100 and the line S22 in the direction of the thickness of the ceramic dielectric base body 100 drawn from the front end of the free ends.

While the ceramic capacitor element 1 in FIG. 2 adopts a transverse configuration in which the electrode surfaces of the internal electrodes 101 and 102 extend parallel to the horizontal surface, a longitudinal configuration achieved by rotating the ceramic capacitor element 1 by approximately 90° from its position in FIG. 2 so that the electrode surfaces of the internal electrodes 101 and 102 extend perpendicular to the horizontal surface may be adopted, instead.

The metal plate terminal 2, one end 21 of which is connected to the terminal electrode 11, is provided with a folded portion 22 in the middle area, and a terminal portion 23 to be connected to the outside toward the other end from the folded portion 22. The metal plate terminal 3, one end 31 of which is connected to the terminal electrode 12, too, is provided with a folded portion 32 in its middle area and a terminal portion 33 to be connected to the outside toward the other end from the folded portion 32. The metal plate terminals 2 and 3 should be constituted of a material having a low electrical resistance and demonstrating outstanding spring property. Typical examples include a phosphor bronze plate. While no particular restriction is imposed on its plate thickness, the plate will be typically 0.1 mm thick.

The ends 21 and 31 of the metal plate terminals 2 and 3 are respectively connected to the terminal electrodes 11 and 12 via bonding members 4 and 5.

Figure 3:
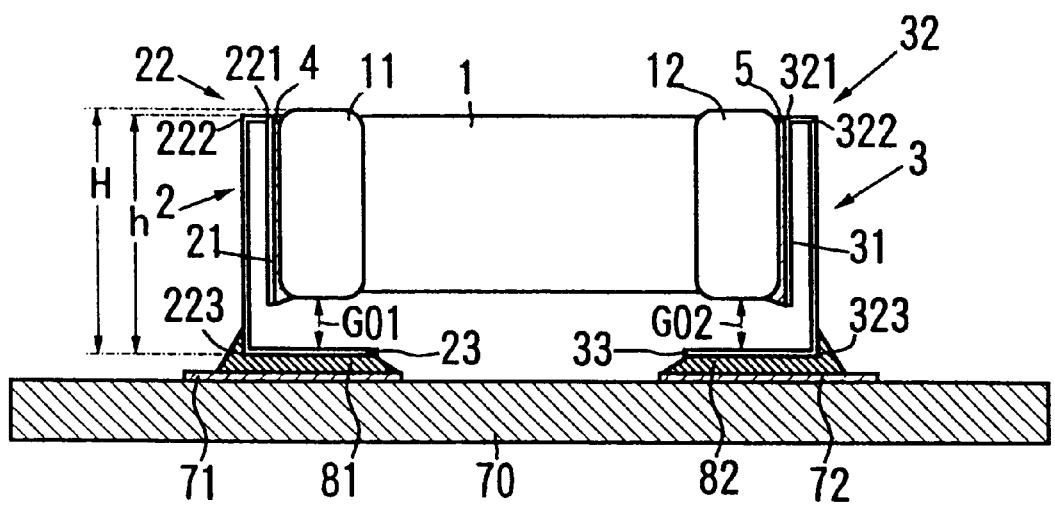
FIG. 3 is a partial sectional view illustrating the ceramic capacitor shown in FIGS. 1 and 2 mounted on a circuit board.

FIG. 3 is a partial sectional view illustrating the ceramic capacitor in FIGS. 1 and 2 mounted on a circuit board. The ceramic capacitor is mounted on a circuit board 70, with conductor patterns 71 and 72 formed at the surface of the circuit board 70. The terminal portion 23 of the metal plate terminal 2 provided at the ceramic capacitor is soldered to the conductor pattern 71 with a solder 81, whereas the terminal portion 33 of the metal plate terminal 3 is soldered to the conductor pattern 72 with a solder 82.

The metal plate terminals 2 and 3, at least a pair of which are provided in the ceramic capacitor according to the present invention, are respectively connected to the terminal electrodes 11 and 12 of the ceramic capacitor element 1 at their ends 21 and 31, and are provided with the folded portions 22 and 32 respectively in their middle areas and the terminal portions 23 and 33 respectively to be connected to the outside toward the other end from the folded portions 22 and 32. The length (height) of the metal plate terminals 2 and 3 structured as described above, extending from the terminal portions to be connected to an external conductor such as a substrate to the ends connected to the terminal electrodes 11 and 12 of the ceramic capacitor element 1 is extended by the folded portions 22 and 32 provided in the middle areas.

For instance, while in a product in the prior art without the folding portions 22 and 32, the height from the terminal portions 23 and 33 to the positions at which the metal plate terminals 2 and 3 are connected by using the bonding members 4 and 5 is a component height H, this height is constituted of the length of the paths h to the apexes of the folded portions 22 and 32 according to the present invention achieving a great increase in height dimension. The length of the paths h can be set smaller than the component height H that is allowed in a ceramic capacitor whose entire length is L by adjusting the positions of the apexes of the folded portions 22 and 32.

In addition, a spring-like effect is achieved by the folded portions 22 and 32. The flexure and the thermal expansion of the circuit board 70 are thus absorbed through the spring effect achieved at the folded portions 22 and 32 to reduce the mechanical stress and the thermal stress occurring at the ceramic capacitor element 1. By selecting the structure and the shape of the folded portions 22 and 32 as appropriate, the distance from the terminal portions 23 and 33 that are mounted at the circuit board 70 to the portions at which the metal electrodes are mounted to the terminal electrodes 11 and 12 of the ceramic capacitor element 1 can be increased by a factor of 2 to 5 compared to the prior art, to prevent cracks from occurring at the ceramic capacitor element 1. Thus, even when the ceramic capacitor is employed as a smoothing capacitor for a switching source that is often mounted at the aluminum circuit board 70, the occurrence of cracks and the risk of resultant arcing can be avoided.

Furthermore, the folded portions 22 and 32 provided at the metal plate terminals 2 and 3, which absorb the flexure and the thermal expansion of the circuit board 70 and prevent an increase in the height. In the case of the embodiment, the length h of the path over which the spring effect is achieved can be set smaller than the component height H of the ceramic capacitor having the full length L, by adjusting the positions of the apexes of the folded portions 22 and 32. As a result, the length h of the path extending from the terminal portions 23 and 33 located toward the circuit board 70 to the ceramic capacitor element mounting portions can be increased for the metal plate terminals 2 and 3 without increasing the component height H, to achieve an improvement in the absorption of the flexure and the thermal expansion of the circuit board 70 by the metal plate terminals 2 and 3, which, in turn, reduces the mechanical stress and the thermal stress occurring at the ceramic capacitor element 1.

The apexes of the folded portions 22 and 32 are set at positions that are lower than the apex of the ceramic capacitor element 1. Namely, h<H is satisfied. This structure makes it possible to keep the component height H at a small value.

The bonding members 4 and 5 for bonding the metal plate terminals 2 and 3 to the terminal electrodes 11 and 12 respectively may be constituted of a conductive adhesive containing resin or of solder. In the connecting structure whereby the metal plate terminals 2 and 3 are connected to the terminal electrodes 11 and 12 via the bonding members 4 and 5 constituted of a conductive adhesive containing resin, hardly any thermal shock is imparted and, consequently, there is no risk of cracks occurring at the ceramic capacitor element 1 before use. This contributes to an improvement in reliability.

It is desirable that the conductive adhesive contain silver particles as its conductive constituent, since silver particles will improve conductivity. Flat silver particles having a particle size of 3 µm or larger are particularly desirable, as silver particles having such a particle size and shape will achieve an increase in the quantity of silver particles relative to the resin to assure good conductivity. However, since, if the particle size of the silver particles becomes too large, their dispersion in the resin becomes poor, to lower the adhesive strength, it is necessary to determine the maximum particle size of the silver particles to be used by taking into consideration the adhesive strength.

Since the ceramic capacitor according to the present invention is employed over a wide range of temperature of −55° C. to 125° C., the resin constituting the conductive adhesive should be a thermosetting resin having a stable temperature resistant property over such a temperature range. Specific examples of such a resin include epoxy-type thermosetting resin, urethane-type thermosetting resin, polyimide-type thermosetting resin and acrylic-type thermosetting resin.

The bonding members 4 and 5 for connecting the metal plate terminals 2 and 3 to the terminal. electrodes 11 and 12 may be constituted of solder instead of the conductive adhesive described above. A solder having a melting point of 200° C. or higher and 400° C. or lower is particularly suited for this application.

When soldering the ceramic capacitor onto the circuit board 70, as illustrated in FIG. 3, the soldering process is implemented at a temperature of approximately 200° C. During this soldering process, the bonding members 4 and 5 connecting the metal plate terminals 2 and 3 to the terminal electrodes 11 and 12 must not become fused. Thus, it is necessary to use a solder having a melting point of 250° C. or higher to constitute the bonding members 4 and 5.

However, if a solder having a melting point of 400° C. or higher is used to constitute the bonding members 4 and 5, heat exceeding 400° C. will be applied to the ceramic capacitor element 1 while soldering the metal plate terminals 2 and 3 to the terminal electrodes 11 and 12, to form thermal cracks at the ceramic capacitor element 1. Thus, the solder must have a melting point of 400° C. or lower.

When solder is used to constitute the bonding members 4 and 5, it is desirable that the metal plate terminals 2 and 3 be provided with a cover film having a non-adhesive property with respect to the solder at, at least, surfaces facing opposite the external connection surfaces of the terminal portions 23 and 33. This aspect is now explained in reference to FIG. 4.

Figure 4:
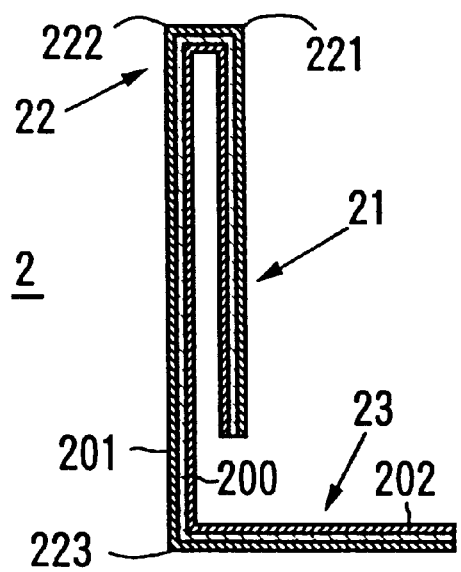
FIG. 4 is an enlarged sectional view illustrating an example of the metal plate terminals that may be employed in the ceramic capacitor according to the present invention.

In the embodiment illustrated in FIG. 4, a substrate 200 is formed from a plate material constituted of phosphor bronze, iron-nickel alloy or the like and a metal film 201 that achieves good soldering is provided on the side where the external connection surface that is connected to the outside through soldering (the outer side) is present, with a cover film 202 to which the solder does not adhere or adheres less readily is laminated at the inside on the opposite side. Since the use of such metal plate terminals 2 and 3 ensures that the solder does not adhere to the surfaces of the terminal portions 23 and 33 as illustrated in FIG. 3, the areas between the terminal portions 23 and 33 and the terminal portions 23 and 33 are not filled with the solder. Thus, the spring property of the metal plate terminals 2 and 3 is not compromised.

The cover film 202, to which the solder does not adhere or adheres less readily, may be laminated over the entire lengths of the metal plate terminals 2 and 3, or may be partially laminated including the terminal portions 23 and 33. The cover film 202 may be constituted of one of the following: a metal oxide film, wax, resin and silicon oil. As a means for forming the metal oxide film, a method whereby a metal film such as Ni or Cu, which readily becomes oxidized is laminated at the surface of the substrate 200 through plating and is left in a natural state to become oxidized may be employed. The metal film 201 may be constituted as an Sn or Pb—Sn plated film.

Now the explanation is given again in reference to FIGS. 1 and 2. The terminal portions 23 and 33 are provided under the ceramic capacitor element 1 over a distance. This structure prevents an increase in the area occupied by the terminal portions 23 and 33 at the substrate to achieve a capacitor with a minimum mounting area.

In the ceramic capacitor illustrated in FIGS. 1 and 2, the folded portion 22 of the metal plate terminal 2 includes a first bent portion 221 and a second bent portion 222. The folded portion 22 is bent to fold away from the terminal electrode 11 at the first bent portion 221, whereas at the second bent portion 222, it is bent to extend in a direction parallel to the end surface over a distance from the first bent portion 221. The metal plate terminal 2 is connected to the terminal electrode 11 at the area extending from its front end to the first bent portion 221.

Likewise, the folded portion 32 of the metal plate terminal 3 includes a first bent portion 321 and a second bent portion 322. The folded portion 32 is bent to fold in a direction that moves away from the terminal electrode 12 at the first bent portion 321, whereas at the second bent portion 322 it is bent to extend in a direction parallel to the end surface over a distance from the first bent portion 321. The metal plate terminal 3 is connected to the terminal electrode 12 at the area extending from its front end to the first bent portion 321.

The structure described above achieves a spring effect in the areas extending from the first bent portions 221 and 321 and the second bent portions 222 and 322 to the terminal portions 23 and 33 so that the flexure and the thermal expansion of the substrate can be absorbed through the spring effect.

The metal plate terminal 2 is provided with a third bent portion 223. The third bent portion 223 partitions the folded portion 22 from the terminal portion 23. In addition, the metal plate terminal 3 is provided with a third bent portion 323. The third bent portion 323 partitions the folded portion 32 from the terminal portion 33. As a result, a spring effect is achieved in the areas extending from the first bent portions 221 and 321 to the third bent portions 223 and 323 so that the flexure and the thermal expansion of the substrate is absorbed through the spring effect.

The metal plate terminals 2 and 3 are bent at the third bent portions 223 and 323 respectively in a direction in which their terminal portions 23 and 33 are placed closer to the ceramic capacitor element 1. The terminal portions 23 and 33 of the metal plate terminals 2 and 3 are provided under the ceramic capacitor element 1 over distances G01 and G02 respectively to minimize the mounting area by preventing an increase in the area occupied by the terminal portions 23 and 33 at the substrate.

In addition, in the structure achieving the distance ΔL1 formed between the free ends of the internal electrodes 101 and the terminal electrode 12 and the distance ΔL2 formed between the free ends of the internal electrodes 102 and the terminal electrode 11, the internal electrodes 101 and the internal electrodes 102 do not overlap each other at the interfaces of the metal plate terminals and the conductive adhesive where cracks and damage tend to occur readily, and near the areas where the conductive adhesive is applied. Thus, the risks of shorting caused by cracks and of arcing resulting from shorting are drastically reduced.

While the first bent portions 221 and 321 and the second bent portions 222 and 322 are bent at an angle of approximately 90° in FIGS. 1 and 2, they may be bent at angles other than 90°. Furthermore, the first bent portions 221 and 321 and the second bent portions 222 and 322 may be bent in a shape without a clear angle, e.g., in an arc shape, instead.

Figure 5:
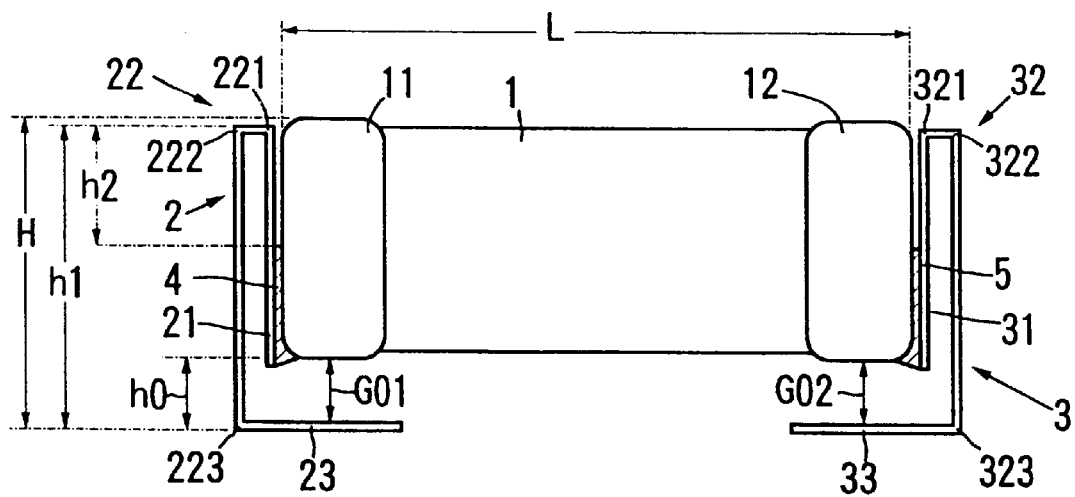
FIG. 5 is a frontal view illustrating another embodiment of ceramic capacitor according to the present invention.

FIG. 5 is a frontal view illustrating another embodiment of the ceramic capacitor according to the present invention. In the figure, the same reference numbers are assigned to components identical to those in FIGS. 1 and 2 to preclude the necessity for repeated explanation thereof. In this embodiment, the bonding members 4 and 5 containing resin are partially deposited onto the terminal electrodes 11 and 12. In this structure, the length of the paths H where the spring effect is achieved is expressed as a value achieved by adding a length h1 of the path extending from the terminal portions 23 and 33 to the second bent portions 222 and 322 and the length h2 of the paths extending from the first bent portions 221 and 321 to the mounting portions (h=h1+h2). This length h of the paths is larger than the component height H. Consequently, the length h of the path extending from the terminal portions 23 and 33 toward the substrate to the ceramic capacitor element mounting portions can be increased for the metal plate terminals 2 and 3 without increasing the component height H to improve the effect for absorbing the flexure and the thermal expansion of the substrate.

Figure 6:
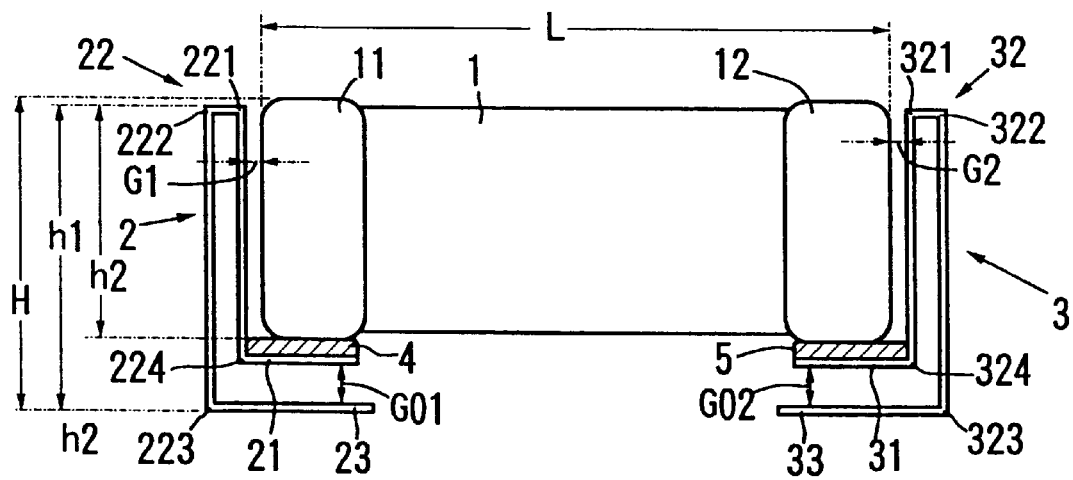
FIG. 6 is a frontal view illustrating yet another embodiment of ceramic capacitor according to the present invention.

FIG. 6 is a frontal view illustrating another embodiment of the ceramic capacitor according to the present invention. In the figure, the same reference numbers are assigned to components identical to those in FIGS. 1 and 2 to preclude the necessity for repeated explanation thereof.

The metal plate terminal 2 is provided with another bent portion 224 in the area extending from its front end to the first bent portion 221, with the portion extending from the other bent portion 224 to the first bent portion 221 facing opposite a side end surface of the ceramic capacitor element 1 over a distance G1 and the area between the front end and the other bent portion 224 connected to the terminal electrode 11. The metal plate terminal 3, too, is provided with another bent portion 324 in the area extending from its front end to the first bent portion 321, with the portion extending from the other bent portion 324 to the first bent portion 321 facing opposite the side end surface over a distance G2 and the area between the front end and the other bent portion 324 connected to the terminal electrode 12.

In this structure, since a spring effect is achieved in the areas extending from the other bent portions 224 and 324 to the third bent portions 223 and 323, the length over which the spring effect is achieved is increased to further improve the effect for absorbing the flexure and the thermal expansion of the substrate. In the embodiment, the length h of the path over which the spring effect is achieved is expressed as a value achieved by adding the length $h1 \leq H$ of the path extending from the first bent portions 23 and 33 to the second bent portions 222 and 322 and the length h2 of the path extending from the first bent portions 221 and 321 to the mounting portions (h=h1+h2). This length h of the path is greater than the component height H. As a result, the length h of the paths extending from the terminal portions 23 and 33 located toward the substrate to the ceramic capacitor element mounting portions can be increased without having to increase the component height H, for the metal plate terminals 2 and 3, to improve the absorption effect through which the flexure and the thermal expansion of the substrate are absorbed.

Figure 7:
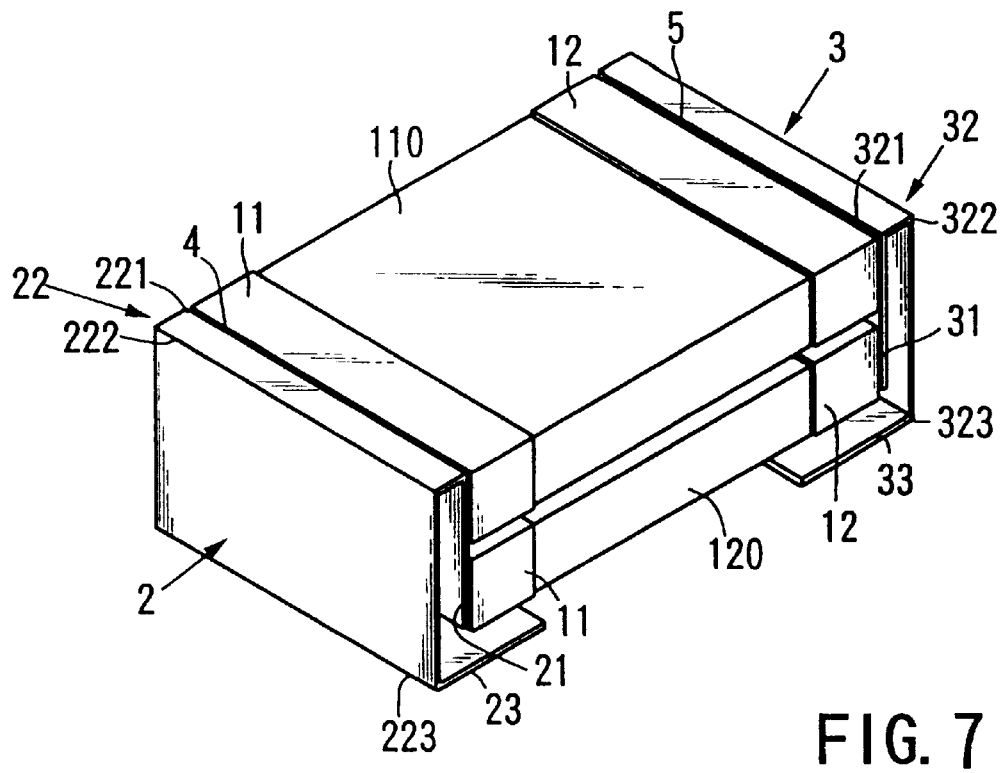
FIG. 7 is a perspective illustrating yet another embodiment of the ceramic capacitor according to the present invention.
Figure 8:
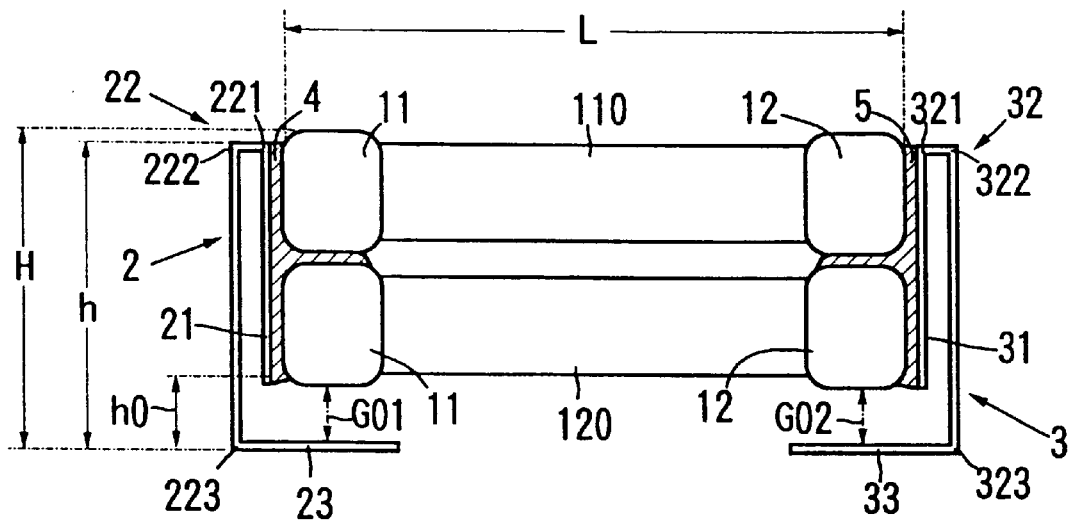
FIG. 8 is a frontal view illustrating yet another embodiment of the ceramic capacitor illustrated in FIG. 7.

FIG. 7 is a perspective illustrating yet another embodiment of ceramic capacitor according to the present invention and FIG. 8 is a frontal view of the ceramic capacitor in FIG. 7. The ceramic capacitor in this embodiment is provided with two ceramic capacitor elements 110 and 120. The ceramic capacitor elements 110 and 120 are laminated sequentially, with the terminal electrodes 11 and 12 connected in parallel via the bonding members 4 and 5. The terminal portions 23 and 33 of the metal plate terminals 2 and 3 are provided under the ceramic capacitor element 120 located at the lowermost layer of the ceramic capacitor elements 110 and 120, over distances G01 and G02 respectively to minimize the mounting area by preventing an increase in the area occupied by the terminal portions 23 and 33 at the substrate.

The folded portions 22 and 32 of the metal plate terminals 2 and 3 include the first bent portions 221 and 321 and the second bent portions 222 and 322 respectively. They are bent away from the terminal electrodes 11 and 12 at the first bent portions 221 and 321, whereas they are bent at the second bent portions 222 and 322 in a direction extending parallel to the side end surfaces of the ceramic capacitor elements 110 and 120 over distances from the first bent portions 221 and 321 respectively.

The portions of the metal plate terminals 2 and 3 extending from their front ends to the first bent portions 221 and 321 are connected to the terminal electrodes 11 and 12 formed at the side end surfaces of the ceramic capacitor elements 110 and 120. The bonding members 4 and 5 constituted of solder or a conductive adhesive containing resin are employed to connect the metal plate terminals 2 and 3 to the terminal electrodes 11 and 12 and to connect the ceramic capacitor elements 110 and 120 to each other.

In the embodiment illustrated in FIGS. 7 and 8, a large capacitance achieved by adding the capacitances of the two ceramic capacitor elements 110 and 120 is realized in addition to the advantages explained earlier in reference to FIGS. 1 and 2.

Figure 9:
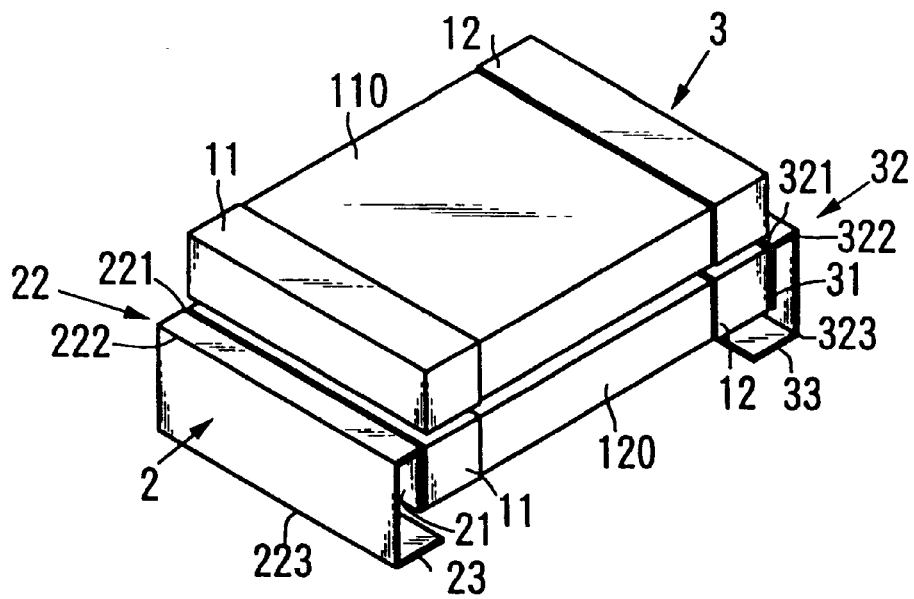
FIG. 9 is a perspective illustrating yet another embodiment of the ceramic capacitor according to the present invention.
Figure 10:
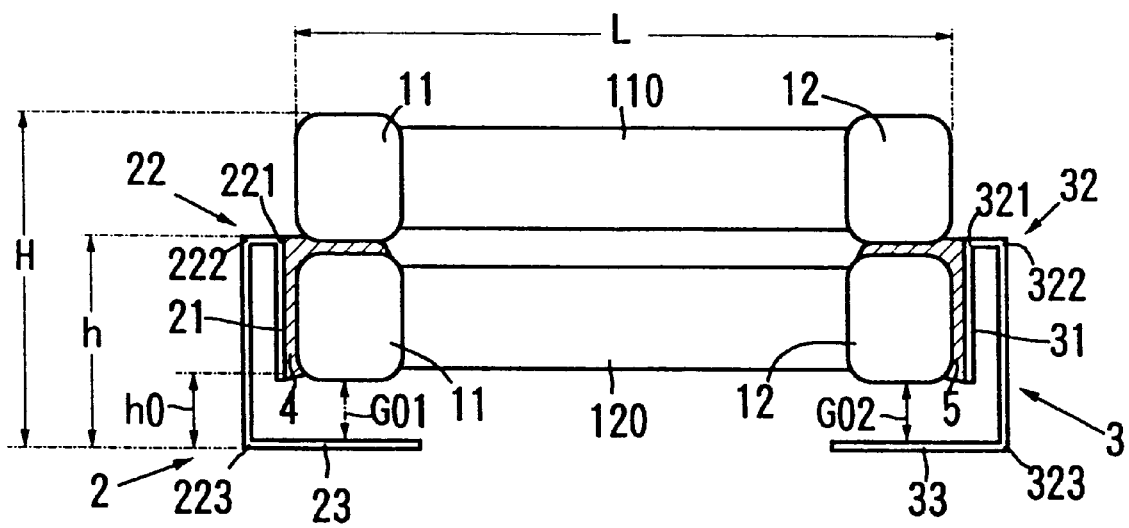
FIG. 10 is a frontal view of the ceramic capacitor in FIG. 9.

FIG. 9 is a perspective illustrating yet another embodiment of the ceramic capacitor according to the present invention and FIG. 10 is a frontal view of the ceramic capacitor in FIG. 9. In the figures, the same reference numbers are assigned to components identical to those in FIGS. 7 and 8. In this embodiment, the metal plate terminals 2 and 3 are only connected to the terminal electrodes 11 and 12 formed at the side end surfaces of the ceramic capacitor element 120 at the areas extending from their front ends to the first bent portions 221 and 321. This embodiment achieves advantages similar to those achieved in the embodiment illustrated in FIGS. 7 and 8.

Figure 11:
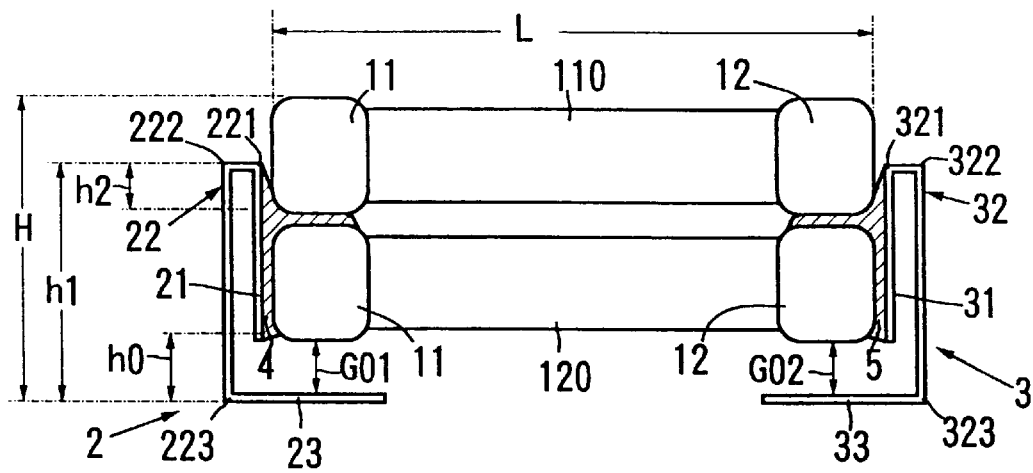
FIG. 11 is a frontal view illustrating yet another embodiment of the ceramic capacitor according to the present invention.

FIG. 11 is a frontal view illustrating yet another embodiment of the ceramic capacitor according to the present invention. In the figure, the same reference numbers are assigned to components identical to those in FIGS. 7 to 10. In this embodiment, the metal plate terminals 2 and 3 are only connected to the terminal electrodes 11 and 12 formed at the side end surfaces of the ceramic capacitor element 120 at the areas extending from their front ends to the first bent portions 221 and 321.

In this embodiment, the length h of the path over which the spring effect is achieved is expressed as a value achieved by adding the length h1 of the paths extending from the terminal portions 23 and 33 to the second bent portions 222 and 322 and the length h2 of the paths extending from the first bent portions 221 and 321 to the mounting portions (h=h1+h2). Consequently, the length h of the paths extending from the terminal portions 23 and 33 located toward the substrate to the ceramic capacitor element mounting portions is increased for the metal plate terminals 2 and 3 to improve the absorption effect for absorbing the flexure and the thermal expansion of the substrate so that the mechanical stress and the thermal stress occurring at the ceramic capacitors 110 and 120 are reduced.

Figure 12:
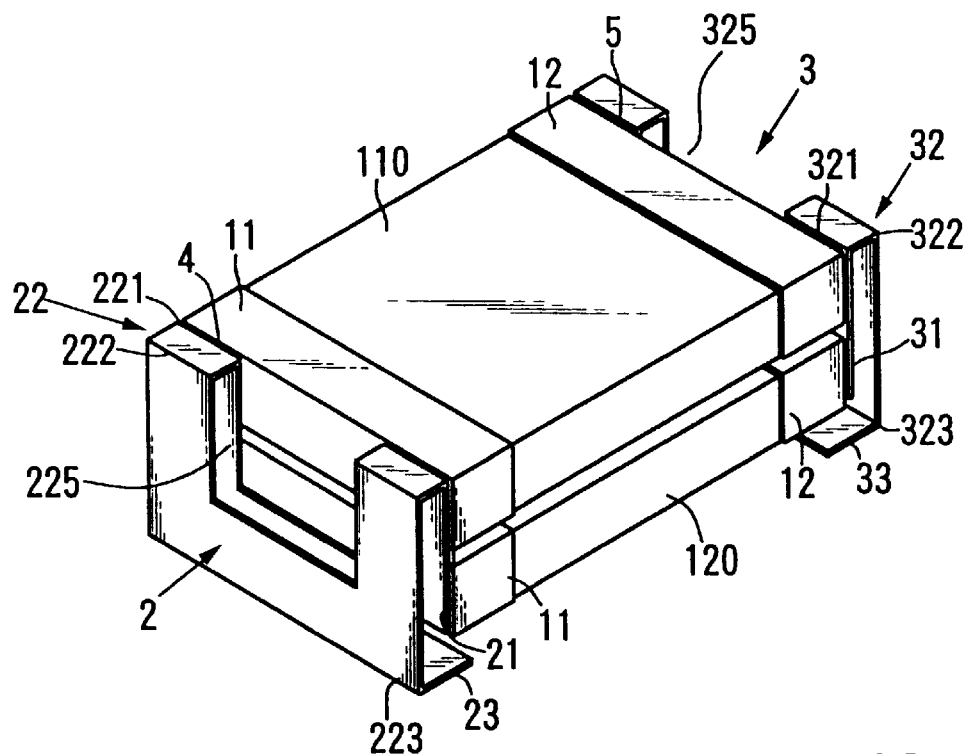
FIG. 12 is a perspective illustrating yet another embodiment of the ceramic capacitor according to the present invention.

FIG. 12 is a perspective illustrating yet another embodiment of the ceramic capacitor according to the present invention. In the figure, the same reference numbers are assigned to components identical to those in FIGS. 8 to 11. In this embodiment, the metal plate terminals 2 and 3 are respectively provided with notched portions 225 and 325 in the middle areas of the folded portions 22 and 32 in the widthwise direction. The presence of these notched portions 225 and 325 reduces heat conduction occurring from the metal plate terminals 2 and 3 toward the ceramic capacitor elements 110 and 120 to lessen the thermal stress at the ceramic capacitor elements 110 and 120. In addition, since the rigidity of the metal plate terminals 2 and 3 is reduced, a spring effect that is suited for absorbing the flexure and the thermal expansion of the substrate is achieved.

Figure 13:
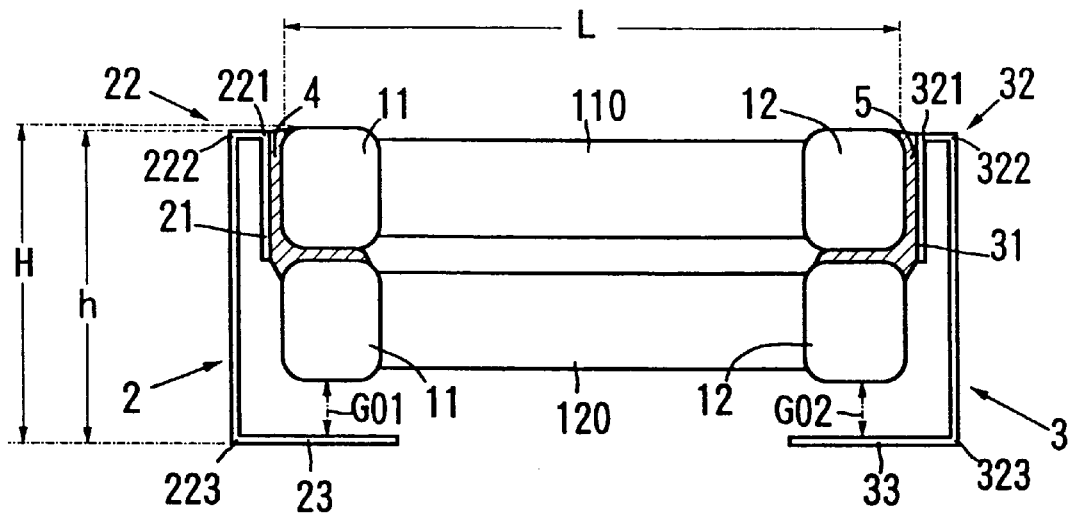
FIG. 13 is a frontal view illustrating yet another embodiment of the ceramic capacitor according to the present invention.

FIG. 13 is a frontal view illustrating yet another embodiment of the ceramic capacitor according to the present invention. In the figure, the same reference numbers are assigned to components identical to those in FIGS. 8 to 12. In this embodiment, the metal plate terminals 2 and 3 are connected only to the terminal electrodes 11 and 12 formed at the side end surfaces of the ceramic capacitor element 110 at the areas extending from their front ends to the first bent portions 221 and 321. The length h of the paths over which the spring effect is achieved is the length of the areas extending from the terminal portions 23 and 33 to the second bent portions 222 and 322. As a result, relative to the terminal portions 23 and 33, the length extending to the positions at which the metal plate terminals 2 and 3 are connected via the bonding members 4 and 5 is the length h of the paths that is larger than the height h0 (see FIG. 1 and the like) in the prior art without the folded portions 22 and 32. Thus, the absorption effect for absorbing the flexure and the thermal expansion of the substrate is improved to reduce the mechanical stress and thermal stress occurring at the ceramic capacitor elements 110 and 120.

Figure 14:
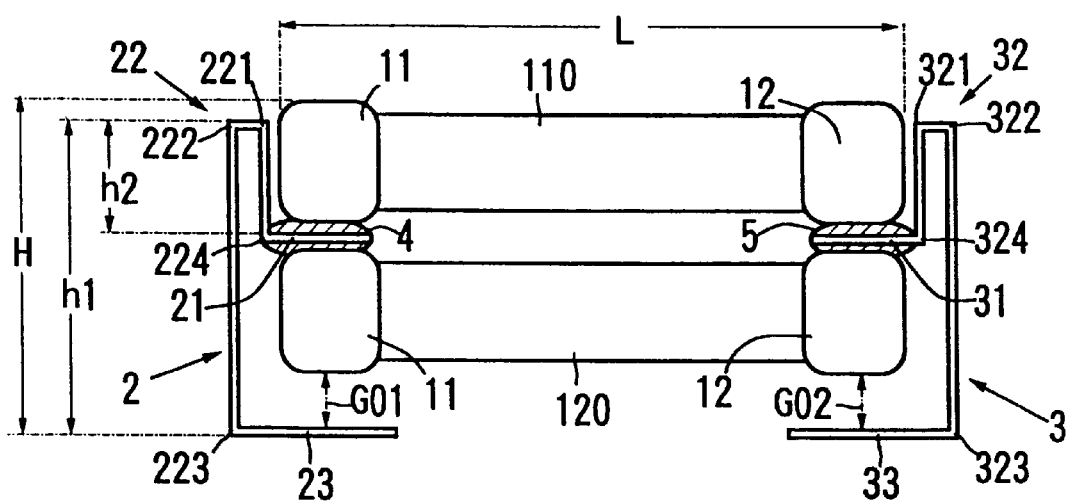
FIG. 14 is a frontal view illustrating yet another embodiment of the ceramic capacitor according to the present invention.

FIG. 14 is a frontal view illustrating yet another embodiment of the ceramic capacitor according to the present invention. The metal plate terminals 2 and 3 are respectively provided with other bent portions 224 and 324 at the areas extending from the front ends to the first bent portions 221 and 321, with the portions extending from the other bent portions 224 and 324 to the first bent portions 221 and 321 facing opposite the side end surfaces of the ceramic capacitor elements 110 and 120 over distances G1 and G2 and the areas between the front ends and the other bent portions 224 and 324 connected to the terminal electrodes 11 and 12. To give further details, at the metal plate terminal 2, the portion between its front end and the other bent portion 224 is located between the terminal electrode 11 of the ceramic capacitor element 110 and the terminal electrode 11 of the ceramic capacitor element 120 and is connected and secured to the terminal electrodes 11 and 11 via the bonding member 4 constituted of solder or a conductive adhesive containing resin. At the metal plate terminal 3, the portion between its front end and the other bent portion 324 is located between the terminal electrode 12 of the ceramic capacitor element 110 and the terminal electrode 12 of the ceramic capacitor element 120 and is connected and secured to the terminal electrodes 12 and 12 via the bonding member 5 constituted of solder or a conductive adhesive containing resin.

The length h of the paths over which the spring effect is achieved is expressed as a value obtained by adding length h1 of the paths extending from the terminal portions 23 and 33 to the second bent portions 222 and 322 and the length h2 of the paths extending from the first bent portions 221 and 321 to the other bent portions 224 and 324 (h=h1+h2). Consequently, the length of the paths extending from the terminal portions 23 and 33 located toward the substrate to the ceramic capacitor element mounting portions is increased for the metal plate terminals 2 and 3 to improve the absorption effect for absorbing the flexure and the thermal expansion of the substrate so that the mechanical stress and the thermal stress occurring at the ceramic capacitor elements 110 and 120 are reduced.

Figure 15:
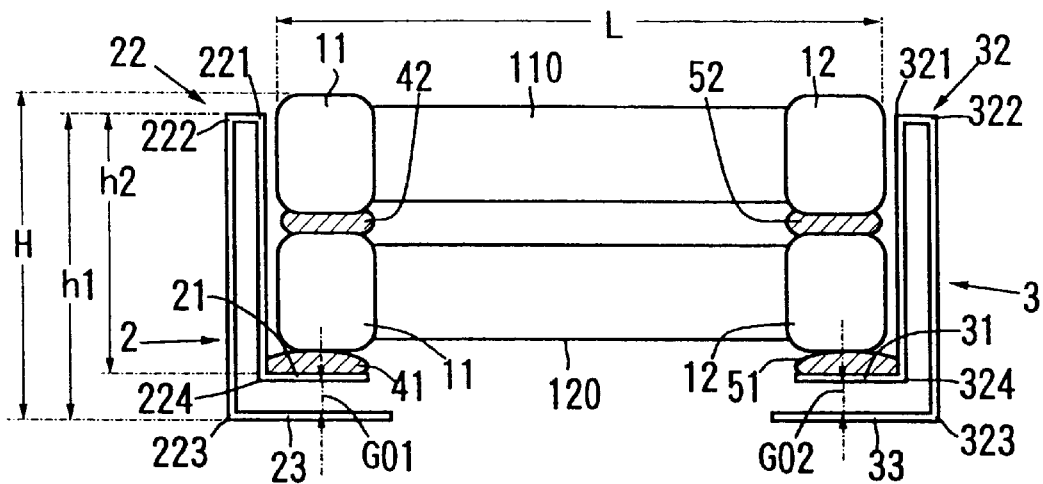
FIG. 15 is a frontal view illustrating yet another embodiment of the ceramic capacitor according to the present invention.

FIG. 15 is a frontal view illustrating yet another embodiment of the ceramic capacitor according to the present invention. In this embodiment, the portion between the front end and the other bent portion 224 at the metal plate terminal 2 is located so that it receives the terminal electrode 11 of the ceramic capacitor element 120 at the lowermost layer and is connected and secured to the terminal electrode 11 by the bonding member 41 constituted of solder or a conductive adhesive containing resin. The portion between the front end and the other bent portion 324 at the metal plate terminal 3 is located so that it receives the terminal electrode 12 of the ceramic capacitor element 120 at the lowermost layer and is connected and secured to the terminal electrode 12 by the bonding member 51 constituted of solder or a conductive adhesive containing resin.

The length h of the paths over which the spring effect is achieved is expressed as a value achieved by adding the length h1 of the paths extending from the terminal portions 23 and 33 to the second bent portions 222 and 322 and the length h2 of the paths extending from the first bent portions 221 and 321 to the other bent portions 224 and 324 (h=h1+h2). Consequently, the length h of the paths extending from the terminal portions 23 and 33 located toward the substrate to the ceramic capacitor element mounting portions is increased for the metal plate terminals 2 and 3 to improve the absorption effect for absorbing the flexure and the thermal expansion of the substrate so that the mechanical stress and the thermal stress occurring at the ceramic capacitor elements 110 and 120 are reduced.

Figure 16:
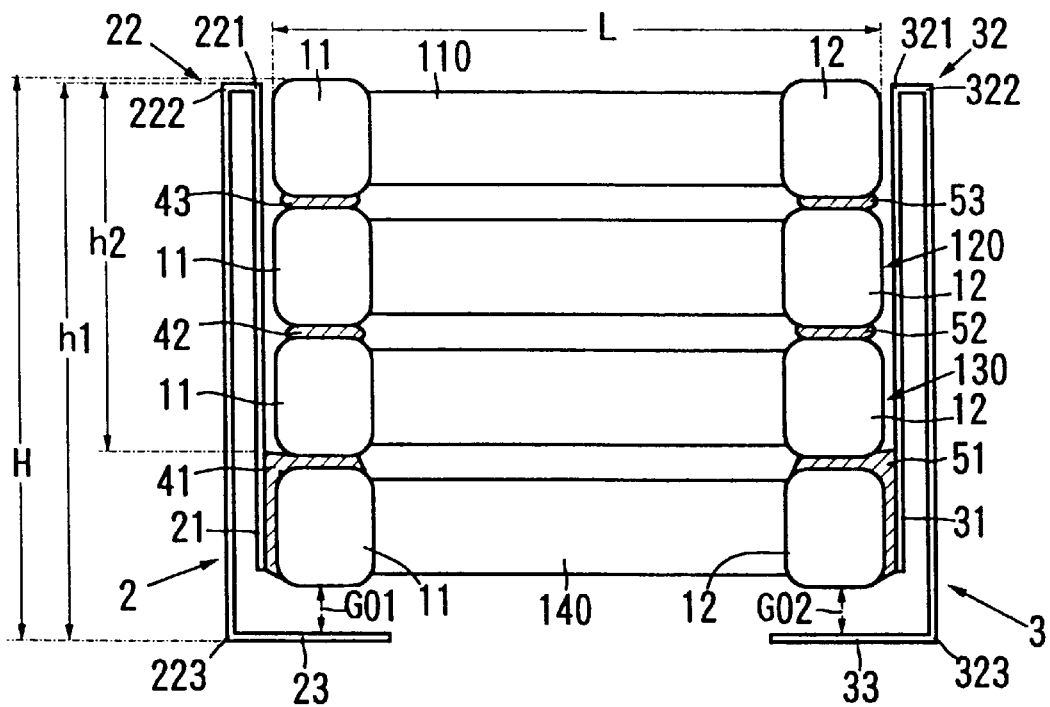
FIG. 16 is a frontal view illustrating yet another embodiment of the ceramic capacitor according to the present invention.

FIG. 16 is a frontal view illustrating yet another embodiment of the ceramic capacitor according to the present invention. In this embodiment, four ceramic capacitor elements 110 to 140 are sequentially laminated, with the areas between the terminal electrodes 11—11 and the areas between the terminal electrodes 12—12 bonded with the bonding members 41 to 43 and 51 to 53 constituted of solder or a conductive adhesive containing resin. In addition, at the metal plate terminal 2, the portion between its front end and the first bent portion 221 is connected and secured to the terminal electrode 11 by the bonding member 41 constituted of solder or a conductive adhesive containing resin. At the metal plate terminal 3, the portion between its front end and the first bent portion 321 is connected and secured to the terminal electrode 12 by the bonding member 51 constituted of solder or a conductive adhesive containing resin.

The embodiment illustrated in FIG. 16 achieves an even greater capacitance than those achieved in the embodiments illustrated in FIGS. 1 to 15. The number of ceramic capacitor elements 110 to 140 may be increased further to achieve the desired capacitance.

The length h of the paths over which the spring effect is achieved is expressed as a value achieved by adding the length h1 of the paths extending from the terminal portions 23 and 33 to the second bent portions 222 and 322 and the length h2 of the paths extending from the first bent portions 221 and 321 to the other bent portions 224 and 324 (h=h1+h2). Consequently, the length h of the paths extending from the terminal portions 23 and 33 located toward the substrate to the ceramic capacitor element mounting portions is increased at the metal plate terminals 2 and 3 to improve the absorption effect for absorbing the flexure and the thermal expansion of the substrate so that the mechanical stress and the thermal stress occurring at the ceramic capacitor elements 110 to 140 are reduced.

Figure 17:
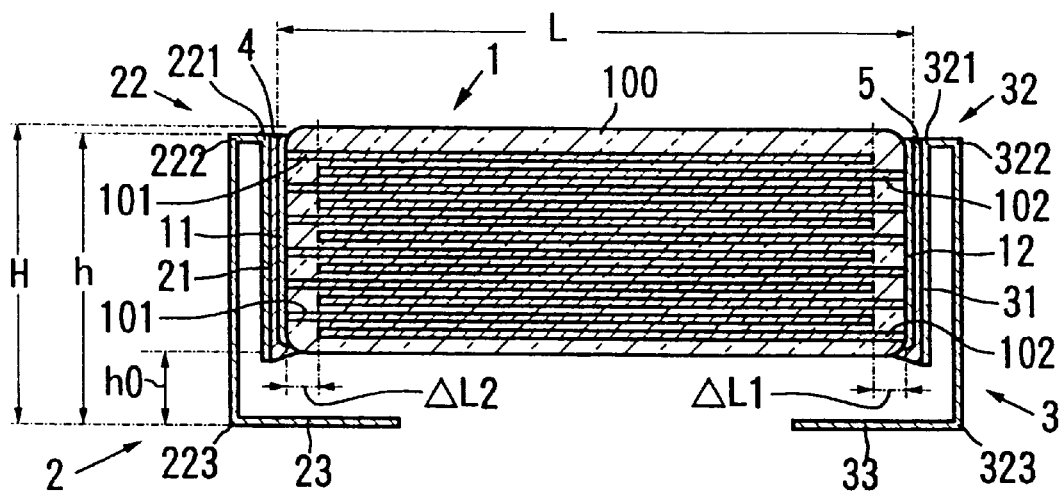
FIG. 17 is a frontal sectional view illustrating yet another embodiment of the ceramic capacitor according to the present invention.

FIG. 17 is a frontal sectional view illustrating yet another embodiment of the ceramic capacitor according to the present invention. In the figure, the same reference numbers are assigned to components identical to those in FIGS. 1 and 2 and their explanation is omitted. In this embodiment, the terminal electrodes 11 and 12 are formed only at the side end surfaces. Since this structure allows the distance ΔL1 between the internal electrodes 101 and the terminal electrode 12 and the distance ΔL2 between the internal electrodes 102 and the terminal electrode 11 to be set in reference to the side end surfaces of the ceramic dielectric base body 100, the area over which the internal electrodes 101 and the internal electrodes 102 overlap each other can be increased to assure an even larger capacity.

Figure 18:
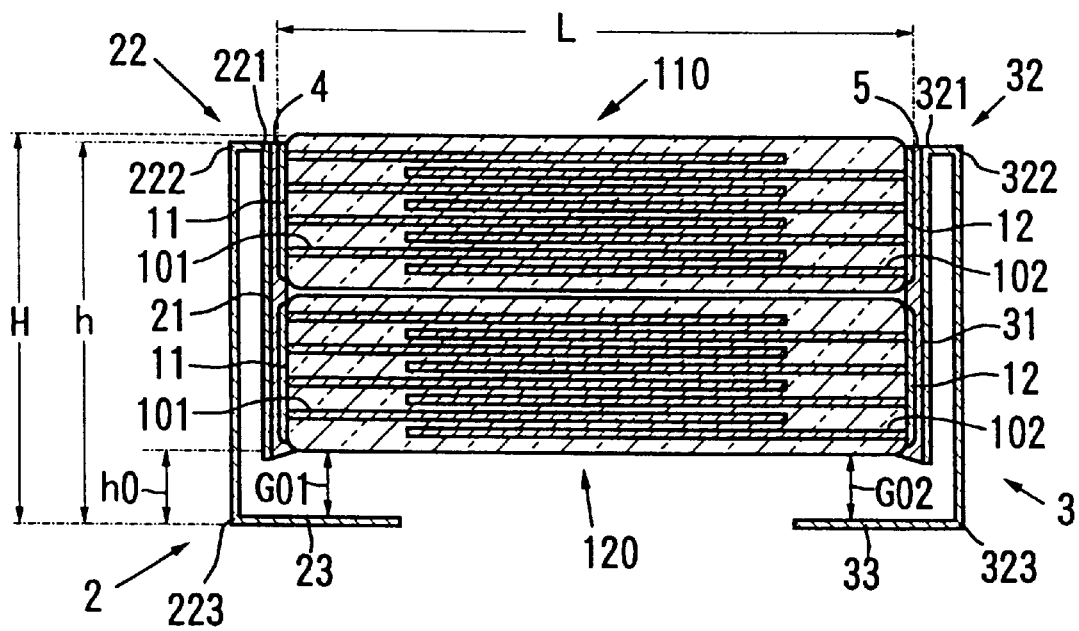
FIG. 18 is a frontal sectional view illustrating yet another embodiment of the ceramic capacitor according to the present invention.

FIG. 18 is a frontal sectional view illustrating yet another embodiment of the ceramic capacitor according to the present invention. In the figure, the same reference numbers are assigned to components identical to those in FIG. 17 and their explanation is omitted. In the embodiment illustrated in FIG. 18, two ceramic capacitor elements 110 and 120 are provided. The ceramic capacitor elements 110 and 120 are laminated sequentially, with the terminal electrodes 11 and 12 connected in parallel via the bonding members 4 and 5. The terminal electrodes 11 and 12 are formed only at the side end surfaces of the ceramic dielectric base body 100. By adopting this embodiment, an even larger capacitance is obtained compared to that achieved in FIG. 17.

Figure 19:
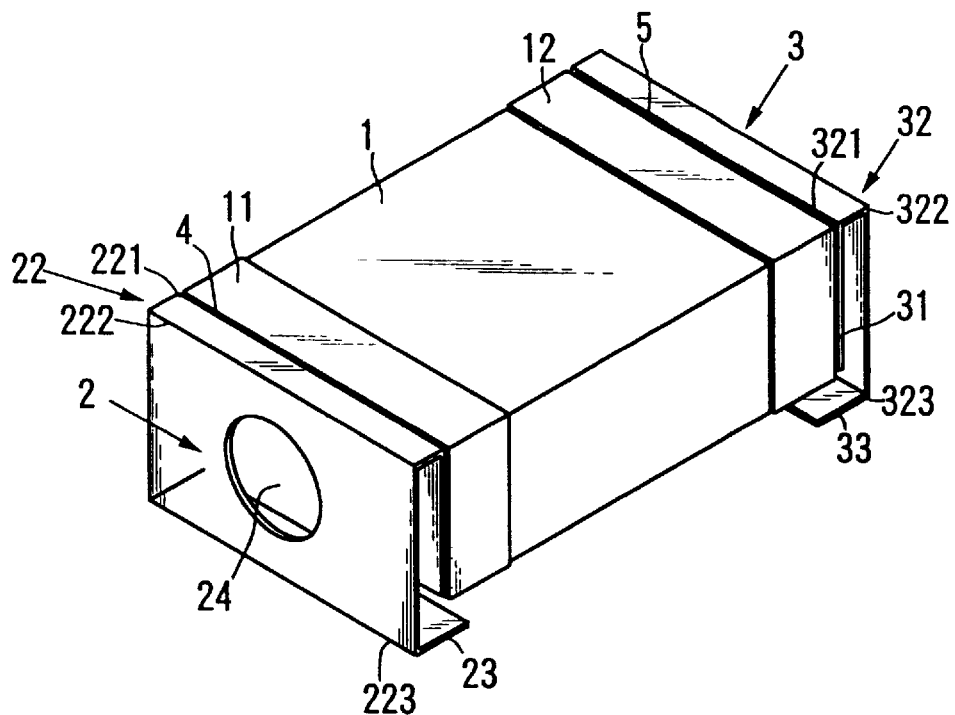
FIG. 19 is a perspective illustrating yet another embodiment of the ceramic capacitor according to the present invention.

FIG. 19 is a perspective illustrating yet another embodiment of the ceramic capacitor according to the present invention. In the figure, the same reference numbers are assigned to components identical to those in FIGS. 1 and 2 to preclude the necessity for repeated explanation thereof. In this embodiment, the metal plate terminal 2 is provided with a punched portion 24. The punched portion faces opposite the mounting portion at which the terminal electrode 11 is mounted. Although not shown, the metal plate terminal 3, too, is provided with a punched portion 34. The punched portion 34 faces opposite the mounting portion at which the terminal electrode 12 is mounted.

The structure described above allows the connection work for connecting the metal plate terminals 2 and 3 to the terminal electrodes 11 and 12 to be carried out with ease by holding the mounting portions of the metal plate terminals 2 and 3 through the punched portions 24 and 34 of the metal plate terminals 2 and 3 respectively to place them in contact with the terminal electrode 11 and 12. In addition, through the punched portions 24 and 34, the mounting portions can be bonded to the terminal electrodes 11 and 12 with a uniform force.

Figure 20:
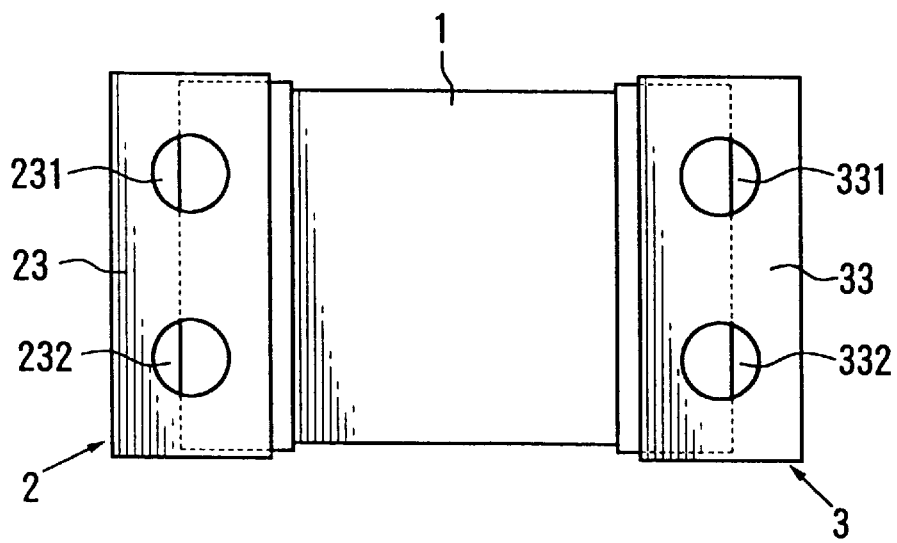
FIG. 20 is a bottom view illustrating yet another embodiment of the ceramic capacitor according to the present invention.

FIG. 20 is a bottom view illustrating yet another embodiment of the ceramic capacitor according to the present invention. In the figure, the same reference numbers are assigned to components identical to those in FIGS. 1 and 2 to preclude the necessity for repeated explanation thereof. In this embodiment, the terminal portion 23 of the metal plate terminal 2 is provided with two holes 231 and 232. Likewise, the terminal portion 33 of the metal plate terminal 3 is provided with two holes 331 and 332. The quantities of holes at the terminal portions are arbitrary.

Figure 21:
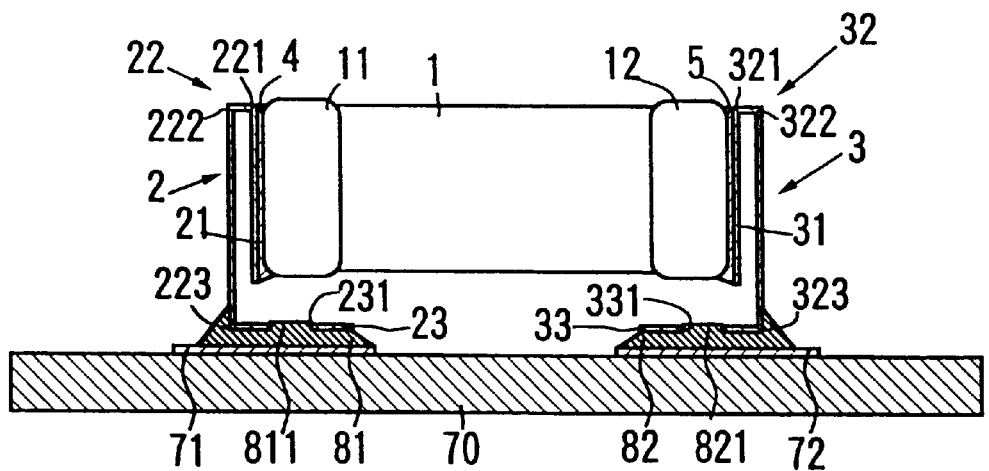
FIG. 21 is a partial sectional view illustrating an example of the mounted ceramic capacitor shown in FIG. 20.

FIG. 21 is a partial sectional view illustrating the ceramic capacitor shown in FIG. 20 mounted at the circuit board 70. As illustrated in FIG. 21, when soldering the ceramic capacitor shown in FIG. 20 to conductor patterns 71 and 72 provided at the circuit board 70, solders 821 and 811 are charged to fill the holes 231 and 232 and the holes 331 and 332 at the terminal portions 23 and 33 respectively to solder the ceramic capacitor onto the circuit board 70 with a high degree of reliability.

Figure 22:
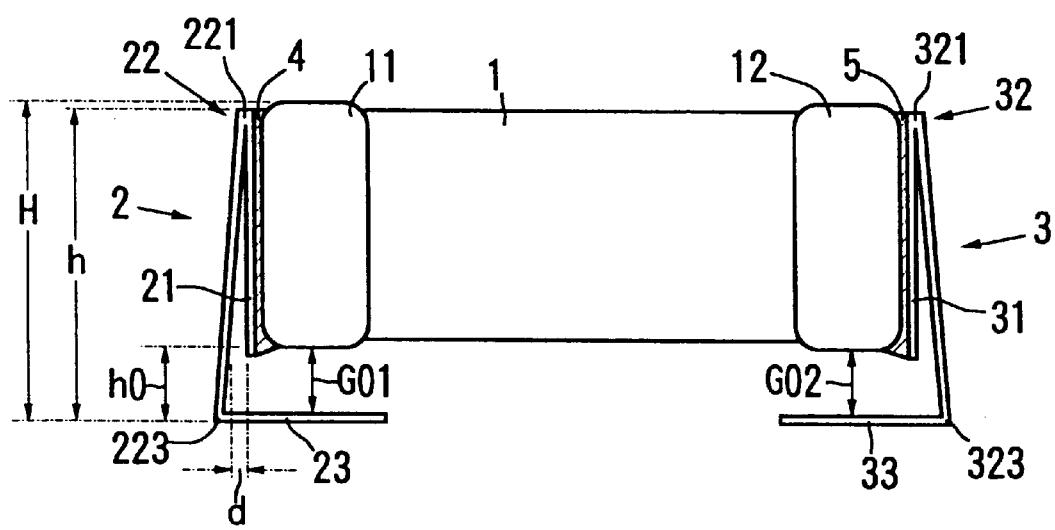
FIG. 22 is a frontal view illustrating yet another embodiment of the ceramic capacitor according to the present invention.

FIG. 22 is a frontal view illustrating yet another embodiment of the ceramic capacitor according to the present invention. In the figure, the same reference numbers are assigned to components identical to those in FIGS. 1 and 2 to preclude the necessity for repeated explanation thereof. In this embodiment, the folded portion 22 of the metal plate terminal 2 includes an acute angle bent portion 221 at which the folded portion 22 is bent to fold at an acute angle in a direction such that it faces roughly opposite the end surface of the ceramic capacitor element 1. Likewise, the folded portion 32 of the metal plate terminal 3 includes an acute-angle bent portion 321 at which the folded portion 32 is bent at an acute angle in a direction such that it faces roughly opposite the end surface of the ceramic capacitor element 1.

In the structure described above, a spring effect is achieved in the areas extending from the bending positions 221 and 321 to the terminal portions 23 and 33, as in the ceramic capacitor illustrated in FIGS. 1 and 2, so that the flexure and the thermal expansion of the substrate are absorbed through the spring effect.

It is desirable that the maximum distance d between the two portions facing opposite each other formed by the bending at each the metal plate terminals 2 and 3 be set at 300 µm or less. The smaller the distance d, the further toward the high frequency side the resonance points of the metal plate terminals 2 and 3 move. Since there is a likelihood of oscillation or vibration at 20 Hz to 200 Hz occurring at a normal source, it is desirable to set the distance d at a small value to ensure that the resonance points are at 200 Hz or higher. This requirement can be satisfied by setting the distance d at 300 µm or less. Table I presents test data indicating the crack occurrence rate (%), obtained by performing excitation for two hours at frequencies ranging from 10 Hz to 500 Hz while varying the distance d in ceramic capacitors structured as illustrated in FIG. 22. The quantity of ceramic capacitors that were tested for individual distances d was 100.

TABLE I

| distance d (µm) | 70 | 90 | 300 | 370 | 640 | 740 |
|---|---|---|---|---|---|---|
| crack occurrence rate (%) | 0 | 0 | 0 | 100 | 85 | 85 |

As Table I indicates, the crack occurrence rate reaches 85% to 100% when the distance d is at 370 µm or more, well above 300 µm. In contrast, when the distance d (µm) is at or less than 300 µm, i.e., at 70 µm and 90 µm, no cracks occur.

Figure 23:
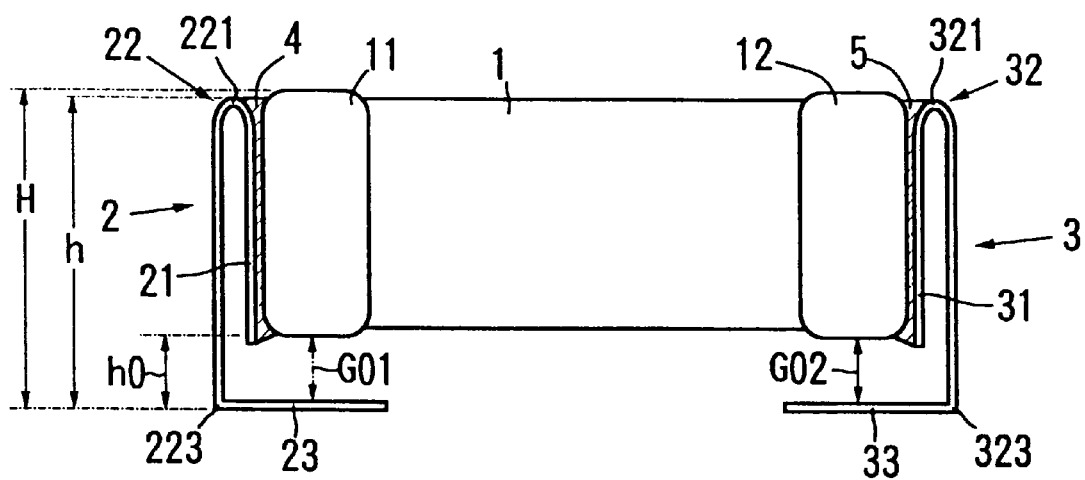
FIG. 23 is a frontal view illustrating yet another embodiment of the ceramic capacitor according to the present invention.

FIG. 23 is a frontal view illustrating yet another embodiment of the ceramic capacitor according to the present invention. In the figure, the same reference numbers are assigned to components identical to those in FIGS. 1 and 2 to preclude the necessity for repeated explanation thereof. The folded portions 22 and 32 on the metal plate terminals 2 and 3 are bent in an arc. In this embodiment, too, advantages similar to those achieved in the embodiment illustrated in FIGS. 1 and 2 are achieved.

Although not illustrated to avoid repeated explanation, it is obvious that the operating modes and the embodiments illustrated in FIGS. 3 to 21 may be adopted when employing the metal plate terminals 2 and 3 shown in FIGS. 22 and 23. In addition, although not illustrated, it goes without saying that there are a number of ways in which the embodiments may be combined.

Next, the crack occurrence rate test data related to specific embodiments and comparison examples are presented.

Embodiment 1

Two ceramic capacitor elements with dimensions of 5.6 mm×5.0 mm×2.3 mm and having a capacitance of 22 µF, temperature characteristics E and a rated voltage of 25V were prepared.

The ceramic capacitor elements described above were each provided with internal electrodes constituted of Ag—Pd inside a ceramic dielectric body constituted of lead-type complex perovskite and terminal electrodes constituted of baked electrodes formed from an Ag paste containing glass frit at the two side end surfaces of the ceramic dielectric body facing opposite each other.

Two such ceramic capacitor elements were placed one on top of the other with their terminal electrodes aligned and were bonded together by applying to the terminal electrodes a conductive adhesive with silver particles dispersed therein. Next, only the portions that were bent inward of a metal plate (phosphor bronze) having a thickness of 0.1 mm which had undergone a silver plating treatment (the middle layer was constituted of nickel, Ni—Ag) were pressed onto the side surfaces of the terminal electrodes of the lower ceramic capacitor of ceramic capacitors that had been stacked over two levels with a specific pressure. In this state, heat was applied at 150° C. for 1 hour to thermally harden the conductive adhesive to prepare a combined ceramic capacitor having the two ceramic capacitor elements and the metal plate terminals bonded at the ends. The shape of the metal plate terminals and the structure through which the metal plate terminals were mounted to the ceramic capacitor elements adopted the mode illustrated in FIG. 13.

Embodiment 2

The shape of the metal plate terminals and the structure with which the metal plate terminals were mounted at the ceramic capacitor elements adopted the mode illustrated in FIGS. 7 and 8. Otherwise, a method similar to that adopted to prepare embodiment 1 was employed to prepare a ceramic capacitor.

Embodiment 3

The shape of the metal plate terminals and the structure with which the metal plate terminals were mounted at the ceramic capacitor elements adopted the mode illustrated in FIG. 11. Otherwise, a method similar to that adopted to prepare embodiment 1 was employed to prepare a ceramic capacitor.

Embodiment 4

The shape of the metal plate terminals and the structure with which the metal plate terminals were mounted at the ceramic capacitor elements adopted the mode illustrated in FIGS. 12 and 13. Otherwise, a method similar to that adopted to prepare embodiment 1 was employed to prepare a ceramic capacitor.

COMPARISON EXAMPLE 1

Figure 24:
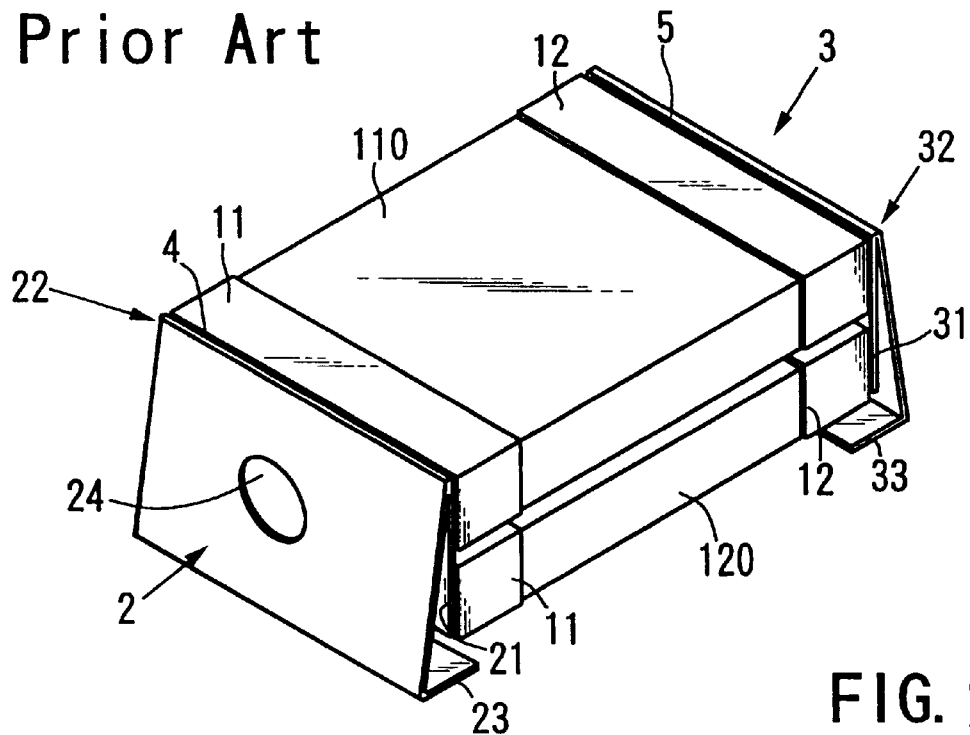
FIG. 24 is a perspective illustrating yet another embodiment of the ceramic capacitor according to the present invention.

The shape of the metal plate terminals and the structure with which the metal plate terminals were mounted at the ceramic capacitor elements adopted a mode in the prior art illustrated in FIG. 24. Otherwise, a method similar to that adopted to prepare embodiment 1 was employed to prepare a ceramic capacitor. In FIG. 24, the same reference numbers are assigned to components identical to those in FIG. 1.

COMPARISON EXAMPLE 2

A ceramic capacitor was prepared by employing the means for producing embodiments 1 to 4 without using any metal plate terminals.

Table II presents the states of crack occurrence manifesting in embodiments 1 to 4 and comparison examples 1 and 2 after a heat cycle test.

TABLE II

| | h (mm) | H (mm) | h/L | crack occurrence rate (%) after 40 cycles | crack occurrence rate (%) after 100 cycles |
|---|---|---|---|---|---|
| Embodiment 1 (FIG. 15) | 9 | 5.5 | 1.61 | 0 | 0 |
| Embodiment 2 (FIGS. 7, 8) | 5 | 5.5 | 0.89 | 0 | 0 |
| Embodiment 3 (FIG. 11) | 3 | 5.5 | 0.54 | 0 | 0 |
| Embodiment 4 (FIG. 9, 10) | 2 | 5.5 | 0.36 | 0 | 0 |
| Comparison example 1 (FIG. 24) | 1 | 5.5 | 0.18 | 30 | 100 |
| Comparison example 2 | 0 | 2.3 | 0.00 | 100 | 100 |

As Table II indicates, no occurrence of cracks was observed in embodiments 1 to 4 according to the present invention. In comparison example 1, a crack occurrence rate of 30% and a crack occurrence rate of 100% resulted after 40 cycles and 100 cycles respectively. In the case of comparison example 2 with no metal plate terminals, a 100% crack occurrence rate was observed both after 40 cycles and 100 cycles.

Embodiments 5 to 7

Four ceramic capacitors with dimensions of 3.2 mm×2.5 mm×1.0 mm and having a capacitance of 6.8 $\mu$F., temperature characteristics E and a rated voltage of 16V were prepared.

The ceramic capacitor elements described above were each provided with internal electrodes constituted of Ag—Pd embedded in a ceramic dielectric body constituted of lead-type complex perovskite and terminal electrodes constituted of baked electrodes formed from an Ag paste containing glass frit at the two side end surfaces of the ceramic dielectric body facing opposite each other.

Four such ceramic capacitor elements were laminated together with their terminal electrodes aligned and were bonded by applying to the terminal electrodes a conductive adhesive with silver particles dispersed therein. Next, the metal plate terminals were mounted by adopting the structure and the positional arrangement illustrated in FIG. 16. A metal plate (phosphor bronze) having a thickness of 0.1 mm that had undergone a silver plating treatment (the middle layer was constituted of nickel, Ni—Ag) was used to constitute the metal plate terminals. The terminal portions located at the front ends of the metal plate terminals were pressed onto the side surfaces of the terminal electrodes of the ceramic capacitor element located at the lowermost layer among the ceramic capacitor elements that had been stacked over four levels, with a specific pressure. In this state, heat was applied at 150° C. for 1 hour to thermally harden the conductive adhesive to prepare a combined ceramic capacitor having the four ceramic capacitor elements and the metal plate terminals bonded at the terminal electrodes.

The length h of the paths where the spring effect is achieved was varied in test pieces prepared through the process described above. The test pieces thus obtained are embodiments 5 to 7.

COMPARISON EXAMPLE 3

The shape of the metal plate terminals and the structure with which the metal plate terminals were mounted at the ceramic capacitor elements adopted the mode in the prior art illustrated in FIG. 24. Otherwise, a method similar to that adopted to prepare embodiments 5 to 7 was employed to prepare a ceramic capacitor.

COMPARISON EXAMPLE 4

A ceramic capacitor was prepared by employing the means for producing embodiments 5 to 7 without using any metal plate terminals.

Table III presents the states of crack occurrence manifesting in embodiments 5 to 7 and comparison examples 3 and 4 after a heat cycle test.

TABLE III

| | h (mm) | H (mm) | h/L | crack occurrence rate (%) after 40 cycles | crack occurrence rate (%) after 100 cycles |
|---|---|---|---|---|---|
| Embodiment 5 | 9 | 5.0 | 2.81 | 0 | 0 |
| Embodiment 6 | 3 | 5.0 | 0.94 | 0 | 0 |
| Embodiment 7 | 1.5 | 5.0 | 0.47 | 0 | 0 |
| Comparison example 3 | 1 | 5.0 | 0.31 | 15 | 100 |
| Comparison example 4 | 0 | 1.0 | 0.00 | 100 | 100 |

As Table III indicates, no occurrence of cracks was observed in embodiments 5 to 7 according to the present invention. In comparison example 3, a crack occurrence rate of 15% and a crack occurrence rate of 100% resulted after 40 cycles and 100 cycles respectively. In the case of comparison example 4 with no metal plate terminals, a 100% crack occurrence rate was observed both after 40 cycles and 100 cycles.

Embodiment 8

Four ceramic capacitor elements with dimensions of 5.6 mm×5.0 mm×2.3 mm and having a capacitance of 22 $\mu$F., temperature characteristics E and a rated voltage of 25V were prepared. The ceramic capacitor elements described above were each provided with internal electrodes constituted of Ag—Pd embedded in a ceramic dielectric body constituted of lead-type complex perovskite and terminal electrodes constituted of baked electrodes formed from an Ag paste containing glass frit at the two side end surfaces facing opposite each other.

Four such ceramic capacitor elements were laminated together with their terminal electrodes aligned and bonded by applying to the terminal electrodes a conductive adhesive with silver particles dispersed therein. Next, the metal plate terminals were mounted by adopting the structure and the positional arrangement illustrated in FIG. 16. A metal plate (phosphor bronze) having a thickness of 0.1 mm that had undergone a silver plating treatment (the middle layer was constituted of nickel, Ni—Ag) was used to constitute the metal plate terminals. The terminal portions located at the front ends of the metal plate terminals were pressed onto the side surfaces of the terminal electrodes of the ceramic capacitor element located at the lowermost layer among the ceramic capacitor elements that had been stacked over four levels, with a specific pressure. In this state, heat was applied at 150° C. for 1 hour to thermally harden the conductive adhesive to prepare a combined ceramic capacitor having the four ceramic capacitor elements and the metal plate terminals bonded at the terminal electrodes.

COMPARISON EXAMPLE 5

Two ceramic capacitor elements with dimensions of 5.6 mm×5.0 mm×2.3 mm and having a capacitance of 22 $\mu$F., temperature characteristics E and a rated voltage of 25V were prepared. The ceramic capacitor elements described above were each provided with internal electrodes constituted of Ag—Pd inside a ceramic dielectric body constituted of lead-type complex perovskite and terminal electrodes constituted of baked electrodes formed from an Ag paste containing glass frit at the two side end surfaces of the ceramic dielectric body facing opposite each other.

Two such ceramic capacitor elements were placed one on top of the other with their terminal electrodes aligned and a conductive adhesive with silver particles dispersed therein was applied to the terminal electrodes. Then, a metal plate (phosphor bronze) having a thickness of 0.1 mm that had undergone a plating treatment was pressed in the structure in the prior art illustrated in FIG. 24 with a specific pressure. In this state, heat was applied at 150° C. for 1 hour to thermally harden the conductive adhesive to prepare a combined ceramic capacitor having the two ceramic capacitor elements and the metal plate terminals bonded at the terminal electrodes.

COMPARISON EXAMPLE 6

Four ceramic capacitor elements with dimensions of 3.2 mm×2.5 mm×1.0 mm and having a capacitance of 6.8 $\mu$F., temperature characteristics E and a rated voltage of 16V were prepared. The ceramic capacitor elements described above were each provided with internal electrodes constituted of Ag—Pd inside a ceramic dielectric body constituted of lead-type complex perovskite and terminal electrodes constituted of baked electrodes formed from an Ag paste containing glass frit.

Four such ceramic capacitor elements were placed one on top of another with their terminal electrodes aligned, a conductive adhesive with silver particles dispersed therein was applied to the terminal electrodes and the metal plate terminals were placed on top by adopting the mode in the prior art illustrated in FIG. 24 and they were pressed together with a specific pressure. The metal plate terminals were constituted of a metal plate (phosphor bronze) having a thickness of 0.1 mm that had undergone a plating treatment.

In this state, heat was applied at 150° C. for 1 hour to thermally harden the conductive adhesive to prepare a combined ceramic capacitor having the four ceramic capacitor elements and the metal plate terminals bonded at the terminal electrodes.

Each of the test pieces obtained through the methods explained in reference to embodiment 8 and comparison examples 5 and 6 was placed in a thermal shock test tank with the terminal portions of its metal plate terminals soldered onto an aluminum substrate to undergo thermal shock testing. The thermal shock test was conducted for 40 cycles and 100 cycles with the temperature changing from 125° C. to −55° C. to 125° C. in a cycle. The test pieces were inspected to ascertain the presence/absence of cracks inside the ceramic capacitor elements before and after testing.

While no occurrence of cracks was observed in embodiment 8 according to the present invention, fracture caused by cracks were found in comparison examples 5 and 6. All the fractures occurred at the interfaces of the metal plate terminals and the conductive adhesive and in the vicinity of the areas where the conductive adhesive was applied.

II. Metal Plate Terminal Material

The metal plate terminals 2 and 3 are each constituted of a metal material having a coefficient of average linear expansion $\alpha$ of $13 \times 10^{-6}$ or less over a temperature range of −50° C. to 125° C. Specific examples of such a metal material include an Fe—Ni alloy with an Fe content of 55 wt % to 70 wt % and an Ni content of 35 wt % to 45 wt %. In addition, any of the following metal materials may be employed to constitute the metal plate terminals 2 and 3 in the ceramic capacitor according to the present invention.

Invar (Fe—Ni alloy)
coefficient of linear expansion $\alpha = 1$ to $2 \times 10^{-6}$
42 Alloy (registered trademark) (Fe 58 wt %, Ni 42 wt %)
coefficient of linear expansion $\alpha = 4$ to $5 \times 10^{-6}$
Ru
coefficient of linear expansion $\alpha = 6.8 \times 10^{-6}$
Nimonic 80 (registered trademark)
coefficient of linear expansion $\alpha = 11.7 \times 10^{-6}$
Pt
coefficient of linear expansion $\alpha = 9 \times 10^{-6}$
Pd
coefficient of linear expansion $\alpha = 10.6 \times 10^{-6}$
titanium
coefficient of linear expansion $\alpha = 9 \times 10^{-6}$
Carbon copper
coefficient of linear expansion $\alpha = 10$ to $13 \times 10^{-6}$ It has been confirmed that when the metal plate terminals are constituted by using any of the metal materials having the coefficients of average linear expansion $\alpha$ listed above, no cracks occur and the risk of arcing is thus eliminated as well even if the ceramic capacitor is continuously operated over an extended period of time in an environment in which the temperature changes drastically within the range of −55° C. to 125° C. Consequently, when it is employed as a smoothing capacitor at a switching source that is turned on/off frequently to result in a temperature fluctuation within the range of −55° C. to 125° C., a sufficient degree of reliability is assured.

As explained above, according to the present invention, with the metal plate terminals 2 and 3 each realizing a coefficient of average linear expansion $\alpha$ of $13 \times 10^{-6}$ or less over the temperature range of −55° C. to 125° C., a ceramic capacitor that is free of cracks and also free of risk of arcing even when it is continuously operated over an extended period of time in an environment where the temperature changes drastically over the range of −55° C. to 125° C. is achieved. Next, this point is further explained in reference to crack occurrence rate data on specific embodiments and comparison examples.

Embodiments 11 to 21

Two ceramic capacitor elements with dimensions of 5.6 mm×5.0 mm×2.3 mm and having a capacitance of 22 μF., temperature characteristics E and a rated voltage of 25V were prepared. The ceramic capacitor elements described above were each provided with internal electrodes constituted of Ag—Pd inside a ceramic dielectric body constituted of lead-type complex perovskite and terminal electrodes constituted of baked electrodes formed from an Ag paste containing glass frit at the two side end surfaces of the ceramic dielectric body facing opposite each other.

Two such ceramic capacitor elements were placed one on top of the other with their terminal electrodes aligned and were bonded together by applying to the terminal electrodes a conductive adhesive with silver particles dispersed therein. Next, metal plate terminals having a thickness of 0.1 mm that had undergone silver plating treatment (the middle layer was constituted of nickel, Ni—Ag) were pressed against the terminal electrode side surfaces of the two ceramic capacitors that had been stacked over two levels with a specific pressure. In this state, heat was applied at 150° C. for 1 hour to thermally harden the conductive adhesive to prepare a ceramic capacitor having the two ceramic capacitor elements and the metal plate terminals bonded at the ends. FIG. 24 is a perspective of a ceramic capacitor obtained through the process described above and FIG. 25 is a frontal view of the ceramic capacitor illustrated in FIG. 24.

In embodiments 11 to 21, the metal plate terminals 2 and 3 (see FIGS. 24 and 25) were constituted by using different metal materials having a coefficient of average linear expansion at 13×10$^{-6}$ or lower. In embodiment 11 the metal plate terminals 2 and 3 were constituted of Inconel X-750 (embodiment 11), in embodiment 12 they were constituted of Nimonic 90, in embodiment 13 they were constituted of carbon steel, in embodiment 14 they were constituted of stainless 430, in embodiment 15 they were constituted of Hasteroy B, in embodiment 16 they were constituted of stainless steel 403, in embodiment 17 they were constituted of pure titanium, in embodiment 18 they were constituted of industrial titanium, in embodiment 19 they were constituted of chromium, in embodiment 20 they were constituted of 42 Alloy and in embodiment 21 they were constituted of Invar.

The ceramic capacitors in embodiments 11 to 21 were each secured to an aluminum substrate through soldering, and were subjected to thermal shock to evaluate occurrence of cracks. The thermal shock was applied under the following conditions.

(1) 100 ceramic capacitors each were prepared for embodiments 11 to 21 and they were each soldered onto an aluminum substrate and subjected to thermal shock in a heat test tank.
(2) In each heat cycle, the temperature was rapidly lowered from room temperature (25° C.) to −55° C., was rapidly raised to 125° C. and then was reset to room temperature (25° C.).
(3) Embodiments 11 to 21 each underwent 400 heat cycles.
(4) The products were then evaluated by disengaging them from the aluminum substrates to examine their appearance and inspect their electrical characteristics and then by polishing them to check for internal cracks.

COMPARISON EXAMPLES 11 TO 19

Figure 25:
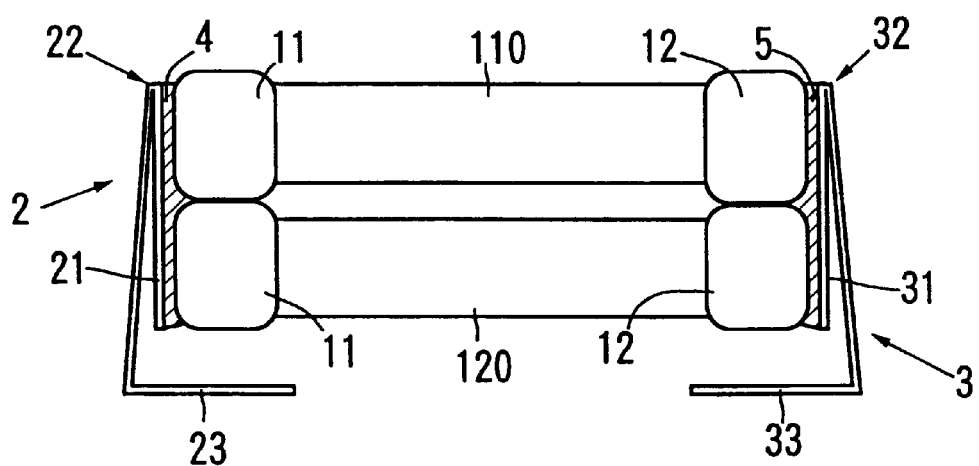
FIG. 25 is a frontal view illustrating yet another embodiment of the ceramic capacitor illustrated in FIG. 7.

Next, for purposes of comparison, ceramic capacitors as illustrated in FIGS. 24 and 25 were manufactured by using metal materials each having a coefficient of average linear expansion exceeding 13×10$^{-6}$ to constitute the metal plate terminals 2 and 3. In comparison example 11, the metal plate terminals 2 and 3 were constituted of aluminum, in comparison example 12, they were constituted of iron, in comparison example 13, they were constituted of silver, in comparison example 14, they were constituted of phosphor bronze, in comparison example 15, they were constituted of stainless steel 304, in comparison example 16, they were constituted of copper, in comparison example 17, they were constituted of nickel silver, in comparison example 18, they were constituted of stainless steel 317 and in comparison example 19, they were constituted of nickel.

The ceramic capacitors in comparison examples 11 to 19 were each secured onto an aluminum substrate through soldering to evaluate occurrence of cracks by applying thermal shock. The thermal shock was applied under conditions identical to those for embodiments 11 to 20. Table IV presents occurrence of cracks observed after the heat cycles in embodiments 11 to 21 and comparison examples 11 to 19.

TABLE IV

| metal terminal material | coefficient of average linear expansion α 13 × 10$^{-6}$ | −55° C. to 125° C. crack occurrence rate (%) | remarks |
|---|---|---|---|
| Inconel X-750 | at or lower | 0 | (Embodiment 11) |
| Nimonic 90 | at or lower | 0 | (Embodiment 12) |
| carbon steel | at or lower | 0 | (Embodiment 13) |
| stainless steel 430 | at or lower | 0 | (Embodiment 14) |
| Hasteroy B | at or lower | 0 | (Embodiment 15) |
| since steel 403 | at or lower | 0 | (Embodiment 16) |
| pure titanium | at or lower | 0 | (Embodiment 17) |
| industrial titanium | at or lower | 0 | (Embodiment 18) |
| chromium | at or lower | 0 | (Embodiment 19) |
| 42 Alloy | at or lower | 0 | (Embodiment 20) |
| Invar | at or lower | 0 | (Embodiment 21) |
| aluminum | at or higher | 100 | (Comparison example 11) |
| iron | at or higher | 100 | (Comparison example 12) |
| silver | at or higher | 93 | (Comparison example 13) |
| phosphor bronze | at or higher | 81 | (Comparison example 14) |
| stainless steel 304 | at or higher | 69 | (Comparison example 15) |
| copper | at or higher | 57 | (Comparison example 16) |
| Silver nickel | at or higher | 45 | (Comparison example 17) |
| stainless steel 317 | at or higher | 33 | (Comparison example 18) |
| nickel | at or higher | 5 | (Comparison example 19) |

As indicated in Table IV, no occurrence of cracks was observed in embodiments 11 to 21 according to the present invention, whereas comparison examples 11 to 19 were all proved to be defective. In particular, those with metal plate terminals constituted of aluminum or iron proved to be defective, having a crack occurrence rate of 100%.

Embodiments 22 to 25

Two ceramic capacitor elements with dimensions of 5.6 mm×5.0 mm×2.3 mm and having a capacitance of 22 μF., temperature characteristics E and a rated voltage of 25V were prepared.

The ceramic capacitor elements described above were each provided with internal electrodes constituted of Ag—Pd inside a ceramic dielectric body constituted of lead-type complex perovskite and terminal electrodes constituted of baked electrodes formed from an Ag paste containing glass frit at the two side end surfaces of the ceramic dielectric body facing opposite each other.

Two such ceramic capacitor elements were placed one on top of the other with their terminal electrodes aligned and bonded by applying to the terminal electrodes a conductive adhesive with silver particles dispersed therein. Next, the metal plate terminals 2 and 3 were secured as illustrated in FIGS. 24 and 25.

In embodiments 22 to 25, the metal plate terminals 2 and 3, prepared by varying the material composition of an Fe—Ni alloy, were used. In embodiment 22, the metal plate terminals 2 and 3 were constituted of an Fe—Ni alloy having a composition of Fe 55%—Ni 45%. In embodiment 23, they were constituted of an Fe—Ni alloy having a composition of Fe 60%—Ni 40%, in embodiment 24, they were constituted of an Fe—Ni alloy having a composition of Fe 65%—Ni 35% and in embodiment 25 they were constituted of an Fe—Ni alloy having a composition of Fe 70%—Ni 30%.

The ceramic capacitors in embodiments 22 to 25 were each secured to an aluminum substrate through soldering and were subjected to thermal shock to evaluate occurrence of cracks. The thermal shock was applied under the conditions described earlier in reference to embodiments 11 to 21.

COMPARISON EXAMPLE 20 AND 21

For purposes of comparison, ceramic capacitors in comparison examples 20 and 21 constituted by forming the metal plate terminals 2 and 3 with Fe—Ni alloys having different material compositions were prepared. In comparison example 20, the metal plate terminals 2 and 3 were constituted of an Fe—Ni alloy having a material composition of Fe 50%—Ni 50% and in comparison example 21, they were constituted of an Fe—Ni alloy having a material composition of Fe 75%—Ni 25%. The ceramic capacitors in the comparison examples were prepared through a process that is otherwise similar to that adopted to prepare embodiments 22 to 25.

The ceramic capacitors in comparison examples 20 and 21 were each secured to an aluminum substrate through soldering and subjected to thermal shock to evaluate occurrence of cracks. The thermal shock was applied under conditions described earlier in reference to embodiments 11 to 21.

Table V presents occurrence of cracks observed in embodiments 22 to 25 and comparison examples 20 and 21 after heat cycles.

TABLE V

| metal terminal material composition Fe—Ni alloy | −55° C. to 125° C. crack occurrence rate (%) | remarks |
| --- | --- | --- |
| Fe 50%—Ni 50% | 8 | (comparison example 20) |
| Fe 55%—Ni 45% | 0 | embodiment 22 |
| Fe 60%—Ni 40% | 0 | embodiment 23 |
| Fe 65%—Ni 35% | 0 | embodiment 24 |
| Fe 70%—Ni 30% | 0 | embodiment 25 |
| Fe 75%—Ni 25% | 16 | (comparison example 21) |

As Table V indicates, no occurrence of cracks was observed in embodiment 22 to 25 according to the present invention. Comparison examples 20 and 21 both proved to be defective.

III. Coefficient of Linear Expansion

The ceramic capacitor element 1 must satisfy $\alpha_1 < \alpha_2$ with $\alpha_1$ representing the coefficient of average linear expansion over a temperature range of 25° C. to −55° C. and $\alpha_2$ representing the coefficient of average linear expansion within a range of 25° C. to 125° C.

Of the metal plate terminals 2 and 3, the metal plate terminal 2 is connected to the terminal electrode 11 and the metal plate terminal 3 is connected to the terminal electrode 12. The metal plate terminals 2 and 3 must satisfy $\beta < 1.3\,\alpha_2$ and $\beta > 0.7\,\alpha_1$ with $\beta$ representing their coefficient of average linear expansion within a range of −55° C. to 125° C.

Next, these requirements are explained.

(A) $\beta < 1.3\,\alpha_2$

An explanation is given on individual cases in which $\beta \leq \alpha_2$ and in which $\alpha_2 < \beta < 1.3\,\alpha_2$.

(A1) $\beta \leq \alpha_2$

When $\beta \leq \alpha_2$, the ceramic capacitor element 1 expands to a larger degree than the metal plate terminals 2 and 3 over the temperature range of 25° C. to 125° C., resulting in a compressive stress occurring at the ceramic capacitor element 1. Thus, when the individual coefficients are set to satisfy $\beta \leq \alpha_2$, no cracks occur at the ceramic capacitor element 1 over the temperature range of 25° C. to 125° C.

(A2) $\alpha_2 < \beta < 1.3\,\alpha_2$

When $\beta > \alpha_2$, the ceramic capacitor element 1 expands to a lesser degree than the metal plate terminals 2 and 3 over the temperature range of 25° C. to 125° C., resulting in tensile stress occurring at the ceramic capacitor element 1. As long as $\beta < 1.3\,\alpha_2$ in this case, no cracks occur even if tensile stress occurs at the ceramic capacitor element 1 since the stress is insignificant.

(B) $0.7\,\alpha_1 < \beta$

An explanation is given on individual cases in which $\beta \geq \alpha_1$ and in which $0.7\,\alpha_1 < \beta < \alpha_1$.

(B1) $\beta \geq \alpha_1$

Over the temperature range of −55 to 25° C., both the ceramic capacitor element 1 and the metal plate terminals 2 and 3 tend to contract proportionally with the temperature relative to 25° C. When $\beta \geq \alpha_1$, since the ceramic capacitor element 1 contracts to a lesser degree than the contraction of the metal plate terminals 2 and 3, compressive stress occurs at the ceramic capacitor element 1. As a result, no cracks occur at the ceramic capacitor element 1.

(B2) $0.7\,\alpha < \beta < \alpha_1$

When $\alpha_1 > \beta$, the ceramic capacitor element 1 contracts to a greater degree than the metal plate terminals 2 and 3 over the temperature range of −55° C. to 25° C. resulting in tensile stress occurring at the ceramic capacitor element 1. As long as $0.7\,\alpha_1 < \beta$ in this case, no cracks occur even if tensile stress occurs at the ceramic capacitor element 1 since the stress is low.

When the main constituent of the dielectric body is barium titanate, the ceramic capacitor element 1 satisfies $\alpha_1 \leq 7 \times 10^{-6}$ and $\alpha_2 \geq 9 \times 10^{-6}$. When the main constituent of the dielectric base body 100 is lead-type complex perovskite, $\alpha_1 \leq 2 \times 10^{-6}$ and $\alpha_2 \geq 3 \times 10^{-6}$ are satisfied. Thus, it is necessary to set the coefficient of average linear expansion β of the metal plate terminals 2 and 3 at different values to ensure that the requirements described earlier are satisfied by taking into consideration the coefficients of average linear expansion $\alpha_1$ and $\alpha_2$ in the individual cases in which the main constituent of the dielectric base body 100 is barium titanate and in which it is a lead-type complex perovskite.

A typical example of the lead-type complex perovskite (relaxor) ceramic dielectric material that may be employed in the present invention is a substance expressed with a composition formula $Pb(Mg_{1/3}Nb_{2/3})O_3$—$Pb(Mg_{1/2}W_{1/2})O_3$—$PbTiO_3$. This composition formula is normally expressed as PMN—PMW—PT. Apart from this, substances expressed through regularized formulae such as PMN—Pnn—PT, PMN—PZt—PT and PMN—Pnn—PMW—PT may be used as well.

In each of the embodiments described above, the coefficients of average linear expansion β of the metal plate terminals 2 and 3 all satisfy $\beta < 1.3 \alpha_2$ and $\beta > 0.7 \alpha_1$ over the temperature range of −55° C. to 125° C. Thus, ceramic capacitors that do not form any cracks and do not present the risk of arcing even when they are continuously operated over an extended period of time in an environment in which the temperature changes drastically over the range of −55° C. to 125° C. are achieved. Next, this point is explained in reference to crack occurrence rate test data.

Embodiments 31 to 33

A lead-type dielectric body with dimensions of 5.6 mm×5.0 mm×2.3 mm and achieving a capacitance of 22 μF. and temperature characteristics E at a rated voltage of 25V was prepared to constitute a ceramic capacitor element. The ceramic capacitor element was provided with internal electrodes constituted of Ag—Pd inside the lead-type ceramic dielectric body and terminal electrodes constituted of baked electrodes that were formed from an Ag paste containing glass frit at the two side end surfaces of the ceramic dielectric body facing opposite each other. The coefficient of average linear expansion $\alpha_1$ of the lead-type ceramic capacitor element over the temperature range of −55° C. to 25° C. was 0.5 to $2 \times 10^{-6}$ and its coefficient of average linear expansion $\alpha_2$ over the temperature range of 25° C. to 125° C. was $4.2 \times 10^{-6}$.

Two such ceramic capacitor elements were placed one on top of the other with their terminal electrodes aligned and were bonded by applying to the terminal electrodes a conductive adhesive with silver particles dispersed therein. Next, only the portions that were bent inward of a 0.1 mm-thick metal plate that had undergone a silver plating treatment (the middle layer was constituted of nickel, Ni—Ag) were pressed onto the side surfaces of the terminal electrodes of the ceramic capacitor that had been achieved by stacking the ceramic capacitor elements over two levels with a specific pressure. In this state, heat was applied for one hour at 150° C. to thermally harden the conductive adhesive to prepare a combined ceramic capacitor having the two ceramic capacitor elements and the metal plate terminals bonded at the ends. The shape of the metal plate terminals and the structure adopted for mounting the metal plate terminals to the ceramic capacitor elements assume the mode illustrated in FIGS. 10 and 11.

Samples of embodiments 31 to 33 were obtained by using metal materials having different coefficients of average linear expansion to constitute the metal plate terminals 2 and 3. In embodiment 31, the metal plate terminals 2 and 3 were constituted of chromium, in embodiment 32 they were constituted of 42 Alloy (Fe 58 wt %—Ni 42 wt %) and in embodiment 33 they were constituted of Invar. The coefficient of average linear expansion β of the chromium used in embodiment 31 is $4.5 \times 10^{-6}$ and the coefficient of average linear expansion β of the 42 Alloy used in embodiment 32 is $4.4 \times 10^{-6}$. Consequently, $0.7 \alpha_1 < \beta$ and to the $< 1.3 \alpha_2$ are satisfied in embodiments 31, 32 and 33.

COMPARISON EXAMPLES 31 TO 45

Ceramic capacitors in comparison examples 31 to 45 were prepared by using materials different from those used in the embodiments to constitute the metal plate terminals 2 and 3 through the process described in reference to embodiments 31 to 33. The materials used in comparison examples 31 to 45 to constitute their metal plate terminals 2 and 3 and their coefficients of average linear expansion β are listed in Table VI. Samples of embodiments 31, 32 and 33 and comparison examples 31 to 45 were each secured onto an aluminum substrate through soldering and were subjected to thermal shock to evaluate occurrence of cracks.

The tests were conducted under the following conditions.

(1) Thermal shock test on the low temperature side (heat cycle test over the −55° C. to 25° C. range)

(1-1) 100 samples of each embodiment and each comparison example were soldered onto an aluminum substrate and were subjected to low-end thermal shock in a low-end thermal shock test tank.

(1-2) In each heat cycle, the temperature was rapidly lowered from 25° C. (room temperature) to −55° C. (low-temperature thermal shock test tank) and then was reset to 25° C. (room temperature)

(1-3) Each test piece underwent 500 heat cycles.

(1-4) Each product was evaluated by disengaging it from the aluminum substrate to examine its appearance and inspect its electrical characteristics and then by polishing the product to check for internal cracks.

(2) Thermal shock tests on the high temperature side (heat cycle tests over the 25° C. to 125° C. range)

(2-1) 100 samples of each embodiment and each comparison example were soldered onto an aluminum substrate and were subjected to high-end thermal shock in a high-temperature thermal shock test tank.

(2-2) In each heat cycle, the temperature was rapidly raised from 25° C. (room temperature) to 125° C. and then was rapidly lowered to 25° C. (room temperature)

(2-3) Each test piece underwent 500 heat cycles.

(2-4) Each product was evaluated by disengaging it from the aluminum substrate to examine its appearance and inspect its electrical characteristics and then by polishing the product to check for internal cracks.

TABLE VI

| dielectric material | lead type (relaxor type) | |
|---|---|---|
| heat cycle | 25→55° C. | 25→125° C. |
| coefficient of linear expansion of dielectric body (× 10⁻⁶) | 0.5 to 2 $\alpha_1$ | 4.2 $\alpha_2$ |
| metal plate terminals | crack occurence rate after 500 heat cycles | |

| metal material | coefficient of linear expansion × 10⁻⁶ | % | | Embodiment/ Comparison example |
|---|---|---|---|---|
| aluminum | 24.3 | 0 | 100 | Comparison example 31 |
| iron | 22.7 | 0 | 100 | Comparison example 32 |
| silver | 18.8 | 0 | 100 | Comparison example 33 |
| phosphor bronze | 18.1 | 0 | 100 | Comparison example 34 |
| stainless steel 304 | 17.3 | 0 | 100 | Comparison example 35 |
| copper | 16.6 | 0 | 100 | Comparison example 36 |
| Silver nickel | 16.2 | 0 | 100 | Comparison example 37 |
| stainless steel 317 | 16.0 | 0 | 100 | Comparison example 38 |
| Nimonic 90 | 11.5 | 0 | 100 | Comparison example 39 |
| carbon steel | 10.6 | 0 | 100 | Comparison example 40 |
| stainless steel 430 | 10.4 | 0 | 97 | Comparison example 41 |
| Hasteroy B | 10.0 | 0 | 91 | Comparison example 42 |
| stainless steel 403 | 9.9 | 0 | 77 | Comparison example 43 |
| pure titanium | 9.0 | 0 | 68 | Comparison example 44 |
| industrial titanium | 7.6 | 0 | 54 | Comparison example 45 |
| chromium | 4.5 | 0 | 0 | Embodiment 31 |
| 42 Alloy | 4.4 | 0 | 0 | Embodiment 32 |
| Invar | 1.5 | 0 | 0 | Embodiment 33 |

Table VI presents occurrence of cracks observed in embodiments 31 to 33 and comparison examples 31 to 45 after the heat cycles.

As indicated in Table VI, while the lead-type ceramic capacitors in comparison examples 31 to 45 were crack-free after the 25° C.→-55° C. low-temperature thermal shock tests, cracks occurred in them at rates of 54% to 100% in the 25° C.→125° C. high-temperature thermal shock tests. In contrast, no occurrence of cracks was observed in embodiments 31 to 33 according to the present invention after the 25° C.→-55° C. low-temperature thermal shock tests or after the 25° C.→-125° C. high-temperature thermal shock tests.

Next, occurrence of cracks in ceramic capacitors constituted by using regular barium titanate type dielectric materials was examined in thermal shock tests. Samples that were examined were embodiments 51 to 59 and comparison examples 51 to 59. The structure of the samples was the same as that of the lead-type ceramic capacitors explained above. The results of the tests are presented in Table VII.

TABLE VII

| dielectric material | barium titanate type (regular material) | |
|---|---|---|
| heat cycle | 25→55° C. | 25→125° C. |
| coefficient of linear expansion of dielectric body (× 10⁻⁶) | 6.0 $\alpha_1$ | 11.5 $\alpha_2$ |
| metal plate terminals | crack occurence rate after 500 heat cycles | |

| metal material | coefficient of linear expansion × 10⁻⁶ | % | | Embodiment/ Comparison example |
|---|---|---|---|---|
| aluminum | 24.3 | 0 | 100 | Comparison example 51 |
| iron | 22.7 | 0 | 100 | Comparison example 52 |
| silver | 18.8 | 0 | 100 | Comparison example 53 |
| phosphor bronze | 18.1 | 0 | 100 | Comparison example 54 |
| stainless steel 304 | 17.3 | 0 | 100 | Comparison example 55 |
| copper | 16.6 | 0 | 93 | Comparison example 56 |
| Silver nickel | 16.2 | 0 | 89 | Comparison example 57 |
| stainless steel 317 | 16.0 | 0 | 87 | Comparison example 58 |
| Nimonic 90 | 11.5 | 0 | 0 | Emhodiment 51 |
| carbon steel | 10.6 | 0 | 0 | Embodiment 52 |
| stainless steel 430 | 10.4 | 0 | 0 | Embodiment 53 |
| Hasteroy B | 10.0 | 0 | 0 | Embodiment 54 |
| stainless steel 403 | 9.9 | 0 | 0 | Embodiment 55 |
| pure titanium | 9.0 | 0 | 0 | Embodiment 56 |
| industrial titanium | 7.6 | 0 | 0 | Embodiment 57 |

TABLE VII-continued

| | | | | |
|---|---|---|---|---|
| chromium | 4.5 | 0 | 0 | Embodiment 58 |
| 42 Alloy | 4.4 | 0 | 0 | Embodiment 59 |
| Invar | 1.5 | 4 | 0 | Comparison example 59 |

The materials constituting the metal plate terminals 2 and 3 and the coefficients of average linear thermal expansion β of the metal plate terminals 2 and 3 employed in embodiments 51 to 59 are as indicated in Table VII, all satisfying 0.7 $\alpha_1 < \beta$ and $\beta < 1.3\ \alpha_2$.

The ceramic capacitors in comparison examples 51 to 59 were prepared in the process identical to that through which the embodiments 51 to 59 were prepared except that the materials to constitute the metal plate terminals 2 and 3 were varied. The materials constituting the metal plate terminals 2 and 3 and their coefficients of average linear expansion β in comparison examples 51 to 59 are listed in Table VII. In none of the comparison examples is 0.7 $\alpha_1 < \beta$ or $\beta < 1.3\ \alpha_2$ satisfied except for comparison example 59, in which 0.7 $\alpha_1 < \beta$ is satisfied and $\beta < 1.3\ \alpha_2$ is not satisfied.

Samples of embodiments 51 to 59 and comparison examples 51 to 59 were each secured onto an aluminum substrate through soldering and were subjected to thermal shock to evaluate occurrence of cracks. The thermal shock tests were conducted under the same conditions as those under which the lead-type ceramic capacitors described earlier were tested. As indicated in Table VII, while no cracks occurred in the barium titanate type ceramic capacitors in comparison examples 51 to 58 in the 25° C.→−55° C. low-temperature thermal shock tests, cracks occurred in them in the 25° C.→−125° C. high-temperature thermal shock tests at rates of 87% to 100%. In comparison example 59 which satisfies 0.7 $\alpha_1 < \beta$ is satisfied but not $\beta < 1.3\ \alpha_2$, cracks occurred at a rate of 4% after the 25° C.→−55° C. low-temperature thermal shock tests.

In contrast, no occurrence of cracks was observed in embodiments 51 to 59 according to the present invention after the 25° C.→−55° C. low-temperature thermal shock tests or in the 25° C.→125° C. high-temperature thermal shock tests.

Other Embodiments

Ceramic capacitor elements having internal electrodes whose main constituent was Ni were adopted in embodiments 31 to 33 and 51 to 59 to conduct a comparative examination of occurrence of cracks. The results of the examination demonstrate almost no significant difference for all of the embodiments, i.e., embodiments 31 to 33 and 51 to 59. Thus, by using internal electrodes whose main constituent is Ni in ceramic capacitor elements, a ceramic capacitor achieving a high degree of corrosion resistance that does not change much over time, is inexpensive and achieves a high degree of reliability.

IV. Soldering Requirements

Figure 26:
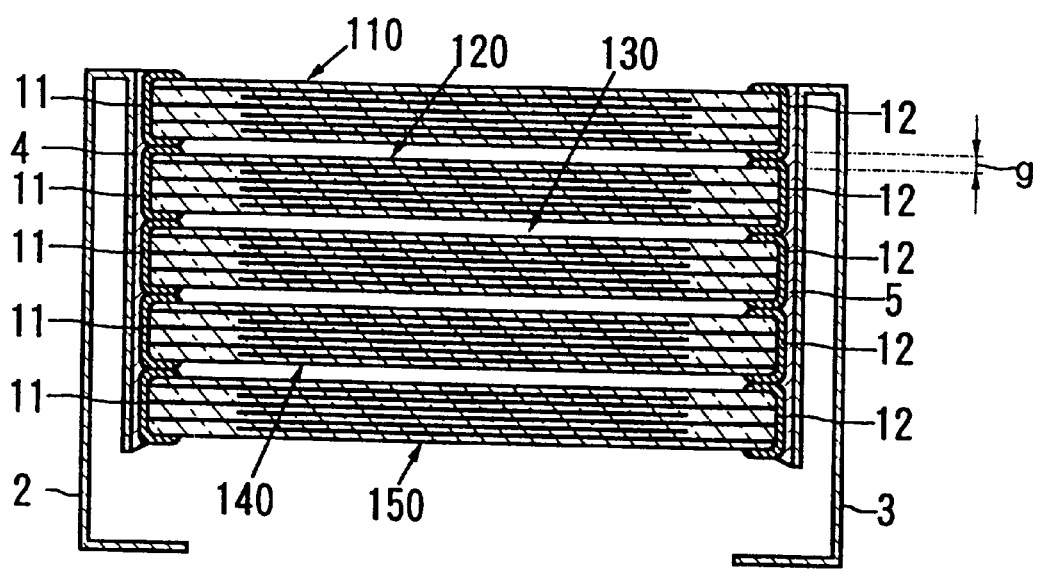
FIG. 26 is a frontal view illustrating yet another embodiment of the ceramic capacitor according to the present invention.

FIG. 26 illustrates a combined ceramic capacitor constituted by combining a plurality of ceramic capacitor elements 110 to 150. In the figure, the same reference numbers are assigned to components identical to those included in the previous drawings. In the combined ceramic capacitor in the figure, the shapes and external dimensions of the plurality of ceramic capacitor elements 110 to 150 are almost the same, with each ceramic capacitor element provided with terminal electrodes 11 and 12 at the two ends facing opposite each other. The plurality of ceramic capacitor elements 110 to 150 are combined with their terminal electrodes 11 aligned with one another and their terminal electrodes 12 aligned with one another to constitute a capacitor assembly. The metal plate terminals 2 and 3 are secured onto the terminal electrodes 11 and 12 provided at the two ends of the capacitor assembly via solders 4 and 5 respectively.

A solder paste composed of solder particles with 90% or more of the particles contained having a particle size of 35 μm to 55 μm and a rosin-type resin constituting the flux, which does not contain an activator constituted of a halogen compound, is used to constitute the solders 4 and 5. It is desirable to achieve a composition in which the solder particles account for 70 wt % to 75 wt % of the total weight and the rosin-type resin account for 25 wt % to 30 wt % of the total weight for this solder paste. Since most of the solder particles contained in the solder paste have a particle size of 35 μm to 55 μm and only a small portion of the flux component is contained in the solder paste, the solder particles are effectively prevented from entering the gaps between the electrodes. In addition, since no activator constituted of a halogen compound of chlorine, bromine or the like is contained, any degradation of the insulation resistance is prevented as well.

In order to achieve the combined ceramic capacitor in the figure, the ceramic capacitor elements 110 to 150 are assembled by maintaining gaps g formed between them within a range of approximately 10 μm to 20 μm. The gaps g may be set at 20 μm or less by combining the ceramic capacitor elements 110 to 150 provided with the terminal electrodes 11 and 12 whose thickness is set at 20 μm or less.

After applying the solder paste through printing or by using a dispenser or the like to the terminal electrodes 11 and 12 at the two ends of the capacitor assembly achieved by combining the ceramic capacitor elements 110 to 150, the metal plate terminals 2 and 3 are mounted to the two ends of the capacitor assembly. It is desirable to apply the solder paste at an application quantity of 0.02 mg/mm² to 0.06 mg/mm² to the areas of the terminal electrodes 11 and 12 and the metal plate terminals 2 and 3 that face opposite each other. At this application quantity, the metal plate terminals 2 and 3 can be secured through soldering while assuring, at least, sufficient mechanical strength. In addition, any degradation of insulation resistance that would occur when the application quantity exceeds 0.06 mg/mm² can be prevented as well.

After the metal plate terminals 2 and 3 are mounted, the capacitor assembly is sent into a reflow furnace for a soldering process. Since the solder paste is composed of the solder particles accounting for 70 wt % to 75 wt % and the rosin-type resin accounting for 25 wt % to 30 wt %, this soldering process can be implemented at 250° C. to 350° C. (temperature rising rate of 14° C./minute). In addition, since the solder paste does not contain an activator constituted of a halogen compound, the soldering process is implemented in a reflow furnace with an oxygen content of 100 ppm or less. Thus, the solder particles are prevented from becoming oxidized and they can be fused with a high degree of reliability even though the solder paste does not contain an activator to prevent formation of solder balls.

By manufacturing a combined ceramic capacitor in this manner, the solder particles and the flux are prevented from entering the gaps between the ceramic capacitor elements 110 to 150, and occurrence of build-up caused by the flux can be prevented. Consequently, a combined ceramic capacitor that achieves a high voltage withstand, a large capacity and a high degree of reliability due to sufficient mechanical strength is realized at low cost.

In order to verify its usability, combined ceramic capacitors were manufactured through various combinations of the individual requirements described above as embodiments 61 to 63, together with an example of the prior art (comparison example 60). In addition, combined ceramic capacitors that do not satisfy all of the requirements were manufactured as comparison examples 61 to 63.

TABLE VIII

| Test piece no. | solder particle size ($\mu$m) | rosin quantity (wt %) | clorine quantity (%) | application quantity (mg/mm$^2$) | distance between electrodes ($\mu$m) |
|---|---|---|---|---|---|
| comparison example 60 | 1 to 50 | 50 to 55 | 1 | 0.16 | 10 to 20 |
| comparison example 61 | 20 to 30 | 50 to 55 | 0 | 0.16 | 10 to 20 |
| comparison example 62 | 35 to 55 | 25 to 30 | 0.2 | 0.16 | 10 to 20 |
| comparison example 63 | 35 to 55 | 25 to 30 | 0.2 | 0.06 | 30 to 50 |
| embodiment 61 | 35 to 55 | 25 to 30 | 0 | 0.06 | 10 to 20 |
| embodiment 62 | 35 to 55 | 25 to 30 | 0 | 0.04 | 10 to 20 |
| embodiment 63 | 35 to 55 | 25 to 30 | 0 | 0.02 | 10 to 20 |

Each of the test pieces was examined to ascertain the $\times 10^{-6}$ presence/absence of solder particle entry and to check for any degradation of the insulation resistance. The presence/absence of solder particle entry was verified using a microscope with a magnifying power of 20 on 10 pieces each of the individual comparison examples and the individual embodiments that were judged to be defective if even one solder particle was found in a distance between the laminated ceramic capacitor elements. The insulation resistance was examined through a pressure cooker test on 30 pieces each of the comparison examples and the embodiments, conducted at a temperature of 120° C. at a pressure of 2 atm for a period of 100 hours. Any sample in which the insulation resistance became reduced to $10^6 \Omega$ or less was judged to be defective. The results of the test are presented in Table IX.

TABLE IX

| test piece no. | entry of solder particles into gaps (%) | pressure cooker test (%) |
|---|---|---|
| comparison example 60 | 100 | 10 |
| comparison example 61 | 10 | 0 |
| comparison example 62 | 0 | 3.4 |
| comparison example 63 | 0 | 6.7 |
| embodiment 61 | 0 | 0 |
| embodiment 62 | 0 | 0 |
| embodiment 63 | 0 | 0 |

As the data in Tables VIII and IX indicate, comparison example 60 which is an example of the prior art and was constituted by using a solder paste containing minute solder particles with their particle sizes ranging from 1 $\mu$m to 50 $\mu$m with a rosin content accounting for 50 wt % to 55 wt %, the solder particles entered gaps between the laminated ceramic capacitor elements at the rate of 100% even though the gaps were set at 10 $\mu$m to 20 $\mu$m. In addition, 10% of comparison example 60, i.e., an example of the prior art constituted by using the solder paste containing chlorine at 1% with the application quantity of solder paste set at 0.16 mg/mm$^2$, manifested a reduction in the insulation resistance.

A solder particle entry occurred in 10% of comparison example 61 that was constituted by using a solder paste containing minute solder particles with particle sizes ranging from 20 $\mu$m to 30 $\mu$m with a rosin content of 50 wt % to 55 wt %, even though the gaps between the laminated ceramic capacitor elements were set at 10 wt % to 20 $\mu$m. However, no deterioration of the insulation resistance was observed in comparison example 61 in which the solder paste did not contain any chlorine. A reduction in the insulation resistance was observed in 3.4% of comparison example 62, in which the solder paste contained chlorine at 0.2%, even though the gaps between the laminated ceramic capacitor elements were set at 10 $\mu$m to 20 $\mu$m. In addition, a reduction in the insulation resistance was observed in 6.7% of comparison example 63 with its solder paste containing chlorine at 0.2% and the gaps between the laminated ceramic capacitor elements set at 30 $\mu$m to 50 $\mu$m.

In contrast, no entry of solder particles or reduction in the insulation resistance was observed in any of embodiments 61 to 63 according to the present invention.

What is claimed is:

1. A ceramic capacitor comprising:
   at least one ceramic capacitor element having terminal electrodes at two side end surfaces facing opposite each other; and
   at least a pair of metal plate terminals each connected to one of said terminal electrodes at the front end thereof and each provided with a folded portion in a middle area thereof and a terminal portion to be connected to the outside to the rear of said folded portion,
   wherein said terminal portion includes at least one hole.

2. The ceramic capacitor of claim 1, wherein:
   said folded portion of each of said at least a pair of metal plate terminals includes at least one bent portion; and
   said at least a pair of metal plate terminals are each connected to one of said terminal electrodes at an area between a first bent portion of said folded portion and said front end.

3. The ceramic capacitor of claim 2, wherein said folded portion of each of said at least a pair of metal plate terminals includes two bent portions.

4. The ceramic capacitor of claim 3, wherein said folded portion of each of said at least a pair of metal plate terminals includes a second bent portion, and is bent away from a respective one of said terminal electrodes at said first bent portion and, at said second bent portion, is bent so as to face opposite said two side end surfaces over a distance from said first bent portion.

5. The ceramic capacitor of claim 2, wherein said at least one bent portion comprises one bent portion bent at an acute angle.

6. The ceramic capacitor of claim 5, wherein the maximum distance between two portions facing opposite each other formed through bending at each of said at least a pair of metal plate terminals is 300 $\mu$m or less.

7. The ceramic capacitor of claim 2, wherein said folded portion of each of said at least a pair of metal plate terminals is bent in an arc.

8. The ceramic capacitor of claim 1, wherein said at least a pair of metal plate terminals are each connected to one of said terminal electrodes at said front end and provided with said folded portion in said middle area thereof and said terminal portion to be connected to the outside to the rear of said folded portion, with a coefficient of average linear expansion α thereof over a range of −55° C. to 125° C. set at $13 \times 10^{-6}$ or lower.

9. The ceramic capacitor of claim 8, wherein said at least a pair of metal plate terminals comprise an alloy with Fe accounting for 55 wt % to 70 wt % and Ni accounting for 30 wt % to 45 wt %.

10. The ceramic capacitor of claim 1, wherein said at least a pair of metal plate terminals and said terminal electrodes are connected via a solder.

11. The ceramic capacitor of claim 10, wherein said solder has a melting point within a range between 200° C. and 400° C.

12. The ceramic capacitor of claim 1, wherein:
said at least one ceramic capacitor element comprises a plurality of ceramic capacitor elements; and
said terminal portion is located under a ceramic capacitor element positioned at a lowermost layer among said plurality of ceramic capacitor elements over a distance.

13. The ceramic capacitor of claim 1, wherein:
said at least a pair of metal plate terminals each have a path length extending from said terminal portion to a mounting portion at which a respective one of said terminal electrodes is mounted; and
said path length is larger than a component height relative to said terminal portion.

14. The ceramic capacitor of claim 1, wherein the apex of said folded portion is located at a position that is lower than the apex of said at least one ceramic capacitor element.

15. The ceramic capacitor of claim 1, wherein:
said at least a pair of metal plate terminals are each provided with a bent portion between said folded portion and said terminal portion; and
said bent portion is bent such that said terminal portion extends toward said at least one ceramic capacitor element.

16. The ceramic capacitor of claim 1, wherein said at least a pair of metal plate terminals are each provided with a bent portion in an area extending from said front end thereof to a first bent portion of said folded portion, a first section extending from said bent portion to said first bent portion facing opposite a respective one of said two side end surfaces over a distance, and a second section between said front end and said bent portion connected to a respective one of said terminal electrodes.

17. The ceramic capacitor of claim 1, wherein:
said at least one ceramic capacitor element comprises a plurality of ceramic capacitor elements; and
said plurality of ceramic capacitor elements are sequentially laminated, with said terminal electrodes thereof connected in parallel.

18. The ceramic capacitor of claim 17, wherein said at least a pair of metal plate terminals are each connected to at least one of said terminal electrodes of said plurality of ceramic capacitor elements.

19. The ceramic capacitor of claim 18, wherein said at least a pair of metal plate terminals each have a bent portion in an area extending from said front end thereof to a first bent portion of said folded portion and each include a section between said front end and said bent portion, said section being located between two terminal electrodes of two adjacent ceramic capacitor elements among said plurality of ceramic capacitor elements and connected to said two terminal electrodes.

20. The ceramic capacitor of claim 19, wherein said section between said front end and said bent portion is provided to support a terminal electrode of a ceramic capacitor element at a lowermost layer among said plurality of ceramic capacitor elements and is connected to said terminal electrode.

21. The ceramic capacitor of claim 1, wherein:
said at least one ceramic capacitor element comprises a plurality of internal electrodes inside a ceramic dielectric base body;
said plurality of internal electrodes are each connected to one of said terminal electrodes at one end, with another end thereof set at a distance from the other one of said terminal electrodes; and
said distance is set at a length that ensures that a vertical line drawn at said another end in a direction of the thickness of said ceramic dielectric base body does not intersect said other one of said terminal electrodes.

22. The ceramic capacitor of claim 1, wherein said terminal electrodes are formed only at said two side end surfaces.

23. The ceramic capacitor of claim 1, wherein:
said at least one ceramic capacitor element satisfies $\alpha_1 < \alpha_2$ with $\alpha_1$ representing a coefficient of average linear expansion thereof over a temperature range of 25° C. to −55° C. and $\alpha_2$ representing a coefficient of average linear expansion thereof over a temperature range of 25° C. to 125° C.; and
said at least a pair of metal plate terminals satisfy $\beta < 1.3 \alpha_2$ and $\beta > 0.7 \alpha_1$ with β representing a coefficient of average linear expansion thereof over a temperature range of −55° C. to 125° C.

24. The ceramic capacitor of claim 23, wherein said at least one ceramic capacitor element, with a main constituent of a dielectric body thereof including barium titanate, satisfies $\alpha_1 \leq 7 \times 10^{-6}$ and $\alpha_2 \geq 9 \times 10^{-6}$.

25. The ceramic capacitor of claim 23, wherein said at least one ceramic capacitor element, with a main constituent of a dielectric body thereof including lead type combined perovskite, satisfies $\alpha_1 \leq 2 \times 10^{-6}$ and $\alpha_2 \geq 3 \times 10^{-6}$.

26. The ceramic capacitor of claim 1, wherein:
said at least one ceramic capacitor element comprises a plurality of ceramic capacitor elements; and
said plurality of ceramic capacitor elements are laminated while maintaining a distance of 20 μm or smaller between individual ceramic capacitor elements, with said terminal electrodes soldered onto said at least a pair of metal plate terminals.

* * * * *